(12) United States Patent
Fucsko et al.

(10) Patent No.: US 7,521,378 B2
(45) Date of Patent: Apr. 21, 2009

(54) LOW TEMPERATURE PROCESS FOR POLYSILAZANE OXIDATION/DENSIFICATION

(75) Inventors: Janos Fucsko, Boise, ID (US); John A Smythe, III, Boise, ID (US); Li Li, Meridian, ID (US); Grady S Waldo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 117 days.

(21) Appl. No.: 10/883,191

(22) Filed: Jul. 1, 2004

(65) Prior Publication Data

US 2006/0003596 A1 Jan. 5, 2006

(51) Int. Cl.
*H01L 21/31* (2006.01)
*H01L 21/469* (2006.01)

(52) U.S. Cl. .............. 438/781; 438/799; 257/E21.489; 427/96.4; 427/344

(58) Field of Classification Search ................ 438/499, 438/781, 789, 799; 257/E21.545, E21.489; 437/96.4, 99.4, 344
See application file for complete search history.

(56) References Cited

U.S. PATENT DOCUMENTS

| | | | |
|---|---|---|---|
| 5,192,697 A | 3/1993 | Leong | |
| 5,310,720 A | 5/1994 | Shin et al. | 437/231 |
| 5,567,661 A | 10/1996 | Nishio et al. | 437/228 |
| 5,922,411 A * | 7/1999 | Shimizu et al. | 427/397.7 |
| 6,017,827 A | 1/2000 | Morgan et al. | 438/745 |
| 6,083,860 A * | 7/2000 | Matsuo et al. | 501/92 |
| 6,191,002 B1 | 2/2001 | Koyanagi | 438/431 |
| 6,265,282 B1 | 7/2001 | Lane et al. | 438/424 |
| 6,376,327 B2 | 4/2002 | Sandhu et al. | 438/396 |
| 6,410,968 B1 | 6/2002 | Powell et al. | 257/412 |
| 6,437,417 B1 | 8/2002 | Gilton | 257/506 |
| 6,465,828 B2 | 10/2002 | Agarwal | 257/296 |
| 6,521,544 B1 | 2/2003 | Agarwal et al. | 438/763 |
| 6,566,229 B2 | 5/2003 | Hong et al. | 438/435 |
| 6,602,785 B1 | 8/2003 | Sharan et al. | 438/682 |
| 6,638,006 B2 | 10/2003 | Selby | 438/723 |
| 6,645,874 B1 | 11/2003 | Torek et al. | 438/723 |
| 6,653,718 B2 | 11/2003 | Leung et al. | 257/634 |
| 6,670,231 B2 | 12/2003 | Powell et al. | 438/216 |
| 6,670,287 B2 | 12/2003 | Akimoto et al. | 438/781 |
| 6,683,006 B2 | 1/2004 | Konishi et al. | 438/723 |
| 7,071,107 B2 * | 7/2006 | Hieda et al. | 438/691 |
| 7,074,690 B1 | 7/2006 | Gauri et al. | |
| 7,105,397 B2 | 9/2006 | Hieda et al. | |
| 7,192,891 B2 * | 3/2007 | Goo et al. | 438/782 |

(Continued)

OTHER PUBLICATIONS

Kubo, et al "Formation of silica coating films from spin-on polysilazane at room temperature and their stability in hot water" J. Mater. Res., vol. 19, No. 2, Feb. 2004 pp. 635-642.*

(Continued)

*Primary Examiner*—Caridad M Everhart
(74) *Attorney, Agent, or Firm*—Whyte Hirschboeck Dudek SC

(57) ABSTRACT

Semiconductor devices, structures and systems that utilize a polysilazane-based silicon oxide layer or fill, and methods of making the oxide layer are disclosed. In one embodiment, a polysilazane solution is deposited on a substrate and processed with ozone in a wet oxidation at low temperature to chemically modify the polysilazane material to a silicon oxide layer.

84 Claims, 13 Drawing Sheets

U.S. PATENT DOCUMENTS

| | | | |
|---|---|---|---|
| 2002/0113241 A1* | 8/2002 | Kubota et al. | 257/79 |
| 2003/0087485 A1* | 5/2003 | Leung et al. | 438/200 |
| 2004/0018684 A1 | 1/2004 | Ji | |
| 2004/0173812 A1* | 9/2004 | Currie et al. | 257/103 |
| 2004/0248374 A1* | 12/2004 | Belyansky et al. | 438/428 |
| 2005/0026443 A1* | 2/2005 | Goo et al. | 438/694 |
| 2005/0179112 A1* | 8/2005 | Belyansky et al. | 257/510 |
| 2007/0117412 A1* | 5/2007 | Goo et al. | 438/787 |

OTHER PUBLICATIONS

Kubo, et al. "Formation of Silica Coating Films from Spin-On Polysilazane at Room Temperature and Their Stability in Hot Water", J. Mater. Res., vol. 19, No. 2, Feb. 2004, pp. 635-642.

* cited by examiner

LOW TEMPERATURE PROCESS FOR POLYSILAZANE OXIDATION/DENSIFICATION

FIELD OF THE INVENTION

The invention relates generally to semiconductor processing methods of forming and utilizing insulative materials for electrical isolation in integrated circuits, and more particularly to processes for forming insulating films from polysilazane coatings.

BACKGROUND OF THE INVENTION

In the fabrication of semiconductor integrated circuits, semiconductor elements are integrated and laid out within a small area on a chip requiring the devices to be placed in close proximity to each other. With the continuing decrease in the dimensions and spacing of devices on integrated circuits (ICs), insulative materials are deposited to electrically isolate the various active components such as transistors, resistors and capacitors. Isolation insulative materials are typically made of silicon dioxide ($SiO_2$).

For example, interlayer dielectric (ILD) or pre-metal dielectric (PMD) layers isolate structures from metal interconnect layers, which may require filling narrow gaps having high aspect ratios (ratio of depth to width) of five or greater. Insulative structures such as shallow trench isolation (STI) regions are also formed in recesses (trenches) within the substrate between components. Such trenches can have a width as narrow as 0.01 to 0.05 microns (μm) or smaller, and filling such narrow features can be difficult. In addition, the dielectric material must be able to withstand subsequent processing steps such as etch and cleaning steps.

Dielectric materials are typically deposited by chemical vapor deposition (CVD) or plasma enhanced chemical vapor deposition (PECVD). For example, in a typical STI method, a trench is etched into a silicon substrate, and the trench is filled by CVD of an oxide such as silicon dioxide ($SiO_2$) as a conformal layer. In the trenches, the conformal layers of oxide are initially formed on the sidewalls and grow in size outward into the center of the trench to where the oxide layers meet. With high aspect ratio features, the width becomes narrower while the depth becomes much greater, it is difficult to form a void-free or seam-free gap fill using standard CVD or PECVD techniques.

High temperature processing after formation of an oxide insulating layer such as an annealing or high temperature densification step can cause a loss of oxygen from the dielectric material resulting in electrically leaking films. To reduce such effects, dielectric materials have been CVD deposited from ozone-enhanced tetraethylorthosilicate (TEOS). Although demonstrating good filling properties, such a process is slow and not cost effective.

Flowable materials such as spin-on dielectrics (SODs), spin-on glasses (SOGs), and spin-on polymers such as silicates, siloxanes, silazanes or silisesquioxanes, have been developed that generally have good gap filling properties. A silicon oxide film is formed by spin-coating a liquid solution of the silicon-containing polymer onto a surface of a substrate, baking the material to remove the solvent, and then thermally oxidizing the polymer layer in an oxygen, or steam, atmosphere at an elevated temperature of up to about 1000° C. A drawback is that high temperature treatments can degrade other structures such as aluminum or other metal wiring layer that have a low thermal tolerance. Another drawback of current methods is the high cost and time required for processing. Such products may require limited thermal budget processing where extensive densification can hurt device parameters. Consequently, lower temperature processing techniques are desired.

Therefore, it would be desirable to provide a process that overcomes such problems.

SUMMARY OF THE INVENTION

The present invention provides methods of forming and treating insulative materials, and devices and systems that incorporate such insulative materials.

In one aspect, the invention provides a process of forming a dielectric (a silicon oxide) film or layer on a semiconductor device. In one embodiment, the silicon oxide layer is formed from a solution comprising a silicon-containing polymer, preferably polysilazane, in which the polymer solution is spin-coated onto a substrate, the solvent is removed to form a solid-phase layer, and the polymer layer undergoes a compositional change caused by a process of wet chemical oxidation at a low temperature of less than about 100° C. to form a silicon oxide layer.

The process can be utilized to form a variety of insulating structures and devices. For example, the process is useful in forming a shallow trench isolation (STI) device, an interlevel insulating layer, among other structures. The spin-on polymer solution can be deposited to substantially fill a high aspect ratio trench or other opening or gap without leaving voids, and the post deposition treatment of low temperature, wet oxidation is then conducted to oxidize the material to form a silicon oxide layer.

In another aspect, the invention provides a silicon oxide layer or fill situated on a substrate, which comprises a spin-on silicon material treated by low temperature, wet oxidation processing (e.g., deionized water/ozone) such that the material is highly oxidized and essentially lacks hydrogen and nitrogen elements, and contains substantially no voids. The silicon oxide layer or fill can be situated, for example, within a high aspect ratio opening such as a shallow trench isolation (STI) structure, as an interlevel insulation layer, among other applications.

Also provided according to the invention is a semiconductor device comprising a substrate and a silicon oxide layer prepared according to the process of the invention, for example, a layer of polysilazane modified by low temperature, wet oxidation to a silicon oxide layer. The oxide layer can comprise a trench isolation structure, for example.

In yet another aspect, the invention provides an integrated circuit device. In one embodiment, the integrated circuit device supported by a substrate, comprises a silicon oxide layer disposed on the substrate, for example, as a fill within an opening such as a shallow trench isolation structure, the silicon oxide layer comprising a flowable silicon-comprising material (e.g., a spin-on polysilazane) treated by low temperature, wet oxidation processing (e.g., deionized water/ozone). The integrated circuit device comprising the low temperature, wet oxidation-treated silicon oxide layer can be incorporated into a die of a circuit module, for example, which can be incorporated into an electronic system.

Films prepared according to the invention are particularly useful in filling narrow gaps and openings less than about 100 nm in width, particularly openings less than about 50 nm in width. The silicon oxide films of the invention are advantageously used as pre-metal dielectric (PMD) interlayers and as shallow trench isolation (STI) structures.

The present silicon oxide material is useful for filling narrow gaps in a PMD interlayer and for filling trenches in shallow trench isolation structures. PMD interlayers may include polysilicon gates and a barrier layer on a substrate, with narrow gaps between the gate structures. The material of the invention can be deposited and processed to fill spaces between the structures with a silicon oxide insulating fill. The process in accordance with the invention achieves a solid, void-free silicon oxide fill or layer having a high oxygen content that can be easily processed and will maintain its integrity in subsequent processing steps.

Advantages of the present procedure include low cost, simplicity, batch processing, and a low thermal budget, among others. The procedure can be used for the oxidation and densification of polysilazane films and spin-on-dielectric (SOD) films having a lower oxygen content than silicon dioxide ($SiO_2$) or hydroxyl content to produce a film that has improved uniform etch properties. The low temperature process (T<100° C.) is particularly useful for deep trench applications (1000-3000 Å or greater) in the fabrication of Flash memory, FINFET, RAD, SDRAM, PC-RAM, and dense DRAM structures. The process avoids the use of high temperatures (i.e., 700-800° C.), which can damage other features that are present on the substrate.

BRIEF DESCRIPTION OF THE DRAWINGS

Preferred embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

FIGS. 1-3 illustrate processing steps forming a trench in a surface of the substrate. FIG. 4 shows deposition of a polymer ((e.g., polysilazane) solution on the substrate and into the trench. FIG. 5 depicts treating the polysilazane layer to form a solid-phase layer. FIG. 6 illustrates a wet oxidation processing step to modify the polysilazane layer to a silicon oxide layer.

DETAILED DESCRIPTION OF THE INVENTION

The invention will be described generally with reference to the drawings for the purpose of illustrating the present preferred embodiments only and not for purposes of limiting the same. The figures illustrate processing steps for use in the fabrication of semiconductor devices in accordance with the present invention. It should be readily apparent that the processing steps are only a portion of the entire fabrication process.

In the context of the current application, the term "semiconductor substrate" or "semiconductive substrate" or "semiconductive wafer fragment" or "wafer fragment" or "wafer" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive substrates, wafer fragments or wafers described above.

The following description with reference to the figures provides illustrative embodiments of the formation of a shallow trench isolation (STI) structure and an insulating layer between two materials (interlevel dielectric layer) formed in accordance with the present invention. Such description is only for illustrative purposes and the present invention can be utilized to provide a silicon oxide (silicon dioxide) layer in other constructions and devices. The present invention is not limited to the described illustrative devices.

FIGS. 1-6 illustrate a method for forming a dielectric layer according to one embodiment of the present invention, in forming a shallow trench isolation (STI) structure, which may be employed for electrically isolating devices in an integrated circuit from one another. By way of example, the STI structure can be formed relative to transistor gate constructions and adjacent transistor source/drain regions with the substrate.

Figure 1:
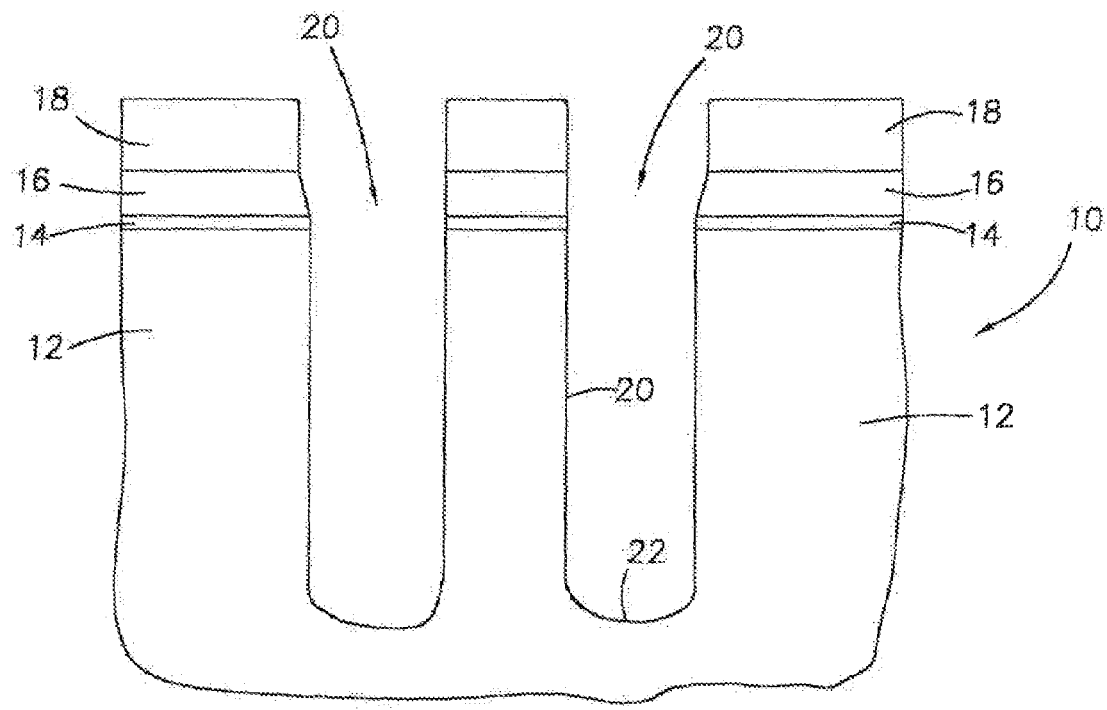
FIGS. 1-6 are diagrammatic cross-sectional views of a fragment of a semiconductor wafer substrate at sequential processing steps showing fabrication of a trench isolation according to an embodiment of the method of the invention.

Referring to FIG. 1, a wafer fragment 10 is shown at a preliminary processing step. The wafer fragment 10 in progress can comprise a semiconductor wafer substrate or the wafer along with various process layers formed thereon, including one or more semiconductor layers or other formations, and active or operable portions of semiconductor devices. A semiconductor device can comprise a transistor, capacitor, electrode, insulator or any of a variety of components commonly utilized in semiconductor structures.

Figure 2:
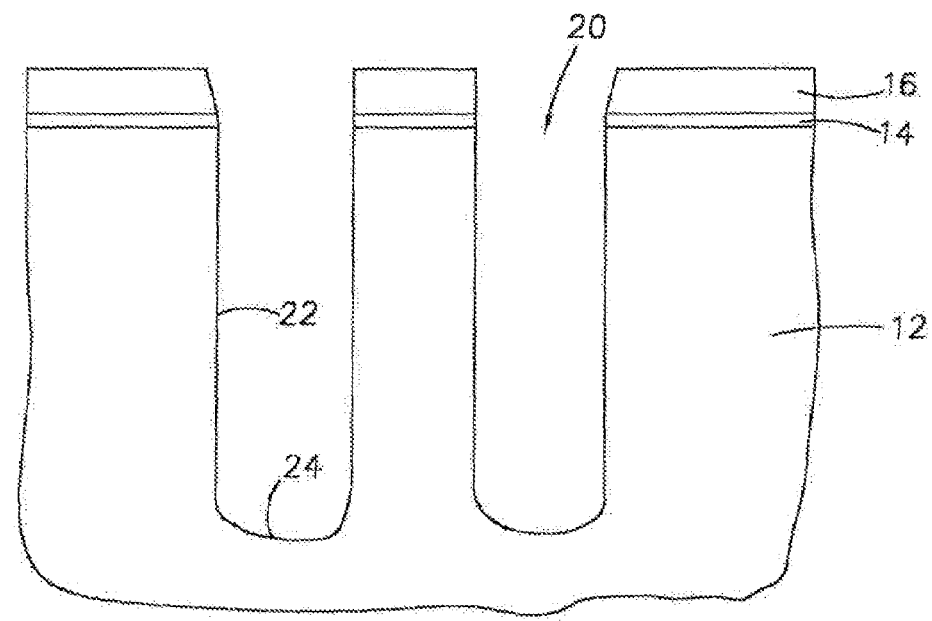

The wafer fragment 10 is shown as comprising a semiconductor substrate 12 having a thin dielectric ($SiO_2$) layer 14 of about 8-20 nm formed thereon, which serves as a pad oxide. Dielectric layer 14 can be formed, for example, by thermal oxidation of substrate 12, by CVD deposition, sputtering, and the like. Optionally, a thicker second dielectric layer 16, preferably a silicon nitride ($Si_3N_4$) layer having a thickness of about 40-200 nm, can be formed over the $SiO_2$ layer 14 by CVD or other deposition technique, to provide an oxidation and CMP hard mask layer. A photoresist mask 18 is applied and patterned using a lithographic patterning technique, and the $SiO_2$ layer 14, $Si_3N_4$ layer 16, and substrate 12 are dry etched to form an opening or recess such a shallow trench 20 in the substrate 12 for device isolation. For example, the trench 20 can have a width of about 0.1 μm and a depth of about 0.5 μm, with an aspect ratio of 5 (=0.5/0.1). Trench 20 includes sidewalls 22 and bottom surface 24. The trench 20 can have sloped or tapered sidewalls 22 or vertical sidewalls formed by an anisotropic etch. The photoresist mask 18 is then removed to form a trenched structure, as shown in FIG. 2.

Figure 3:
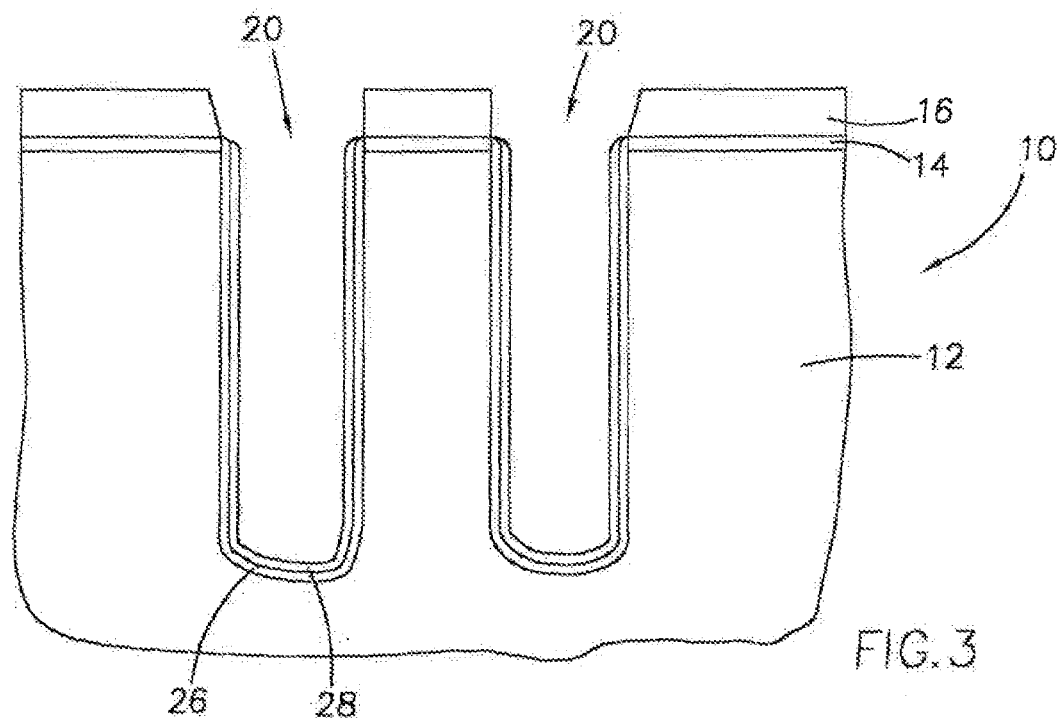

After stripping the photoresist and cleaning the trenched structure, a thin silicon oxide ($SiO_2$) layer 26 can then be formed on the sidewalls 22 and bottom surface 24 of the trench 20, for example, by thermal oxidation, high-pressure oxidation, or high density plasma CVD using a silane-based material or TEOS, for example, as depicted in FIG. 3. Generally, the silicon oxide layer 26 is about 50 angstroms (Å) to about 500 Å thick. Optionally, as illustrated, a thin silicon nitride barrier layer (liner) 28 can be formed over the silicon oxide layer 26 to a thickness of about 100 Å or less, for example, by CVD using $SiH_4$ and $NH_3$ as source gases.

Figure 4:
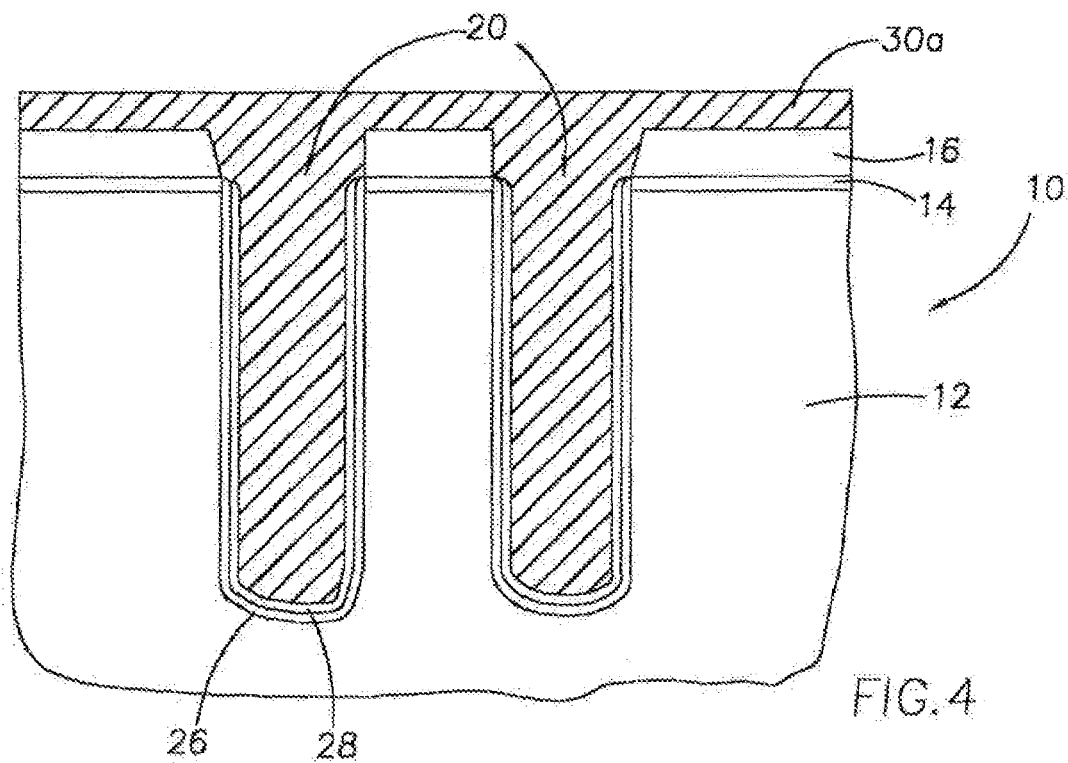

As shown in FIG. 4, a spin-on silicon-containing polymer solution is coated on the substrate 12 and into the trench 20 to form a silicon polymer layer 30a. Typically, the silicon-containing polymer layer is formed on the substrate by spin coating or a "spin-on-glass (SOG)" process, although other methods such as flow coating, dipping or spraying can be used.

In a preferred embodiment, the silicon-containing polymer is deposited as a coating from a polysilazane solution in an organic solvent by spin coating (or SOG process) to fill a predetermined portion or the entire trench. Polysilazanes contain $Si_xN_yH_z$ type units in which the Si atoms are in a "reducing environment" in —Si—NH— bonds. Examples of suitable polysilazanes that can be used include hexamethyldisilazane (HMDS), tetramethyldisilazane, octamethylcyclotetrasilazine, hexamethylcyclotrisilazine, diethylaminotrimethylsilane, and dimethylaminotrimethylsilane, among others, with perhydro-polysilazane being preferred. Polysilazane material cannot be etched or processed reasonably without modification, and even 500:1 HF will etch it non-uniformly with greater than 1000 Å/minute etch rate. Oxidation of N bonds is required to transform this material to $SiO_2$.

In forming a layer on the substrate, a solution of polysilazane is dropped onto a surface of a silicon substrate or layer on the substrate while rotating the substrate on a horizontal plane to form a uniformly-coated film of the solution on the entire surface of the substrate or layer due to the centripetal force applied to the substrate (e.g. wafer). The thickness of the polysilazane coating layer 30a can be controlled by means of the concentration of the coating solution and the speed of rotation of the substrate. The coating layer 30a generally ranges in thickness from about 30 nm to about 500 nm.

The polysilazane solution is prepared with a compatible organic solvent commonly used in coating solutions of spin-on polymers. Suitable organic solvents include, for example, dibutyl ether (DBE), toluene, xylene, and the like. The concentration of the polysilazane in solution can be varied to adjust the consistency (i.e., viscosity) of the solution and thickness of the coating. A solution containing between about 4% to about 30% by weight polysilazane can be used, more preferably, a solution containing about 8% to about 20% by weight polysilazane. Additional minor amounts of additives such as surfactants and binders can be included in the solution.

The conditions under which the polysilazane solution is spin-coated onto the surface of the substrate 12 include a substrate temperature of about 18° C. to about 25° C., and a typical spin rotation of about 500 rpm to about 6,000 rpm for a rotation time of about 2 seconds. A typical layer is about 50 nm to about 500 nm thick.

Figure 5:
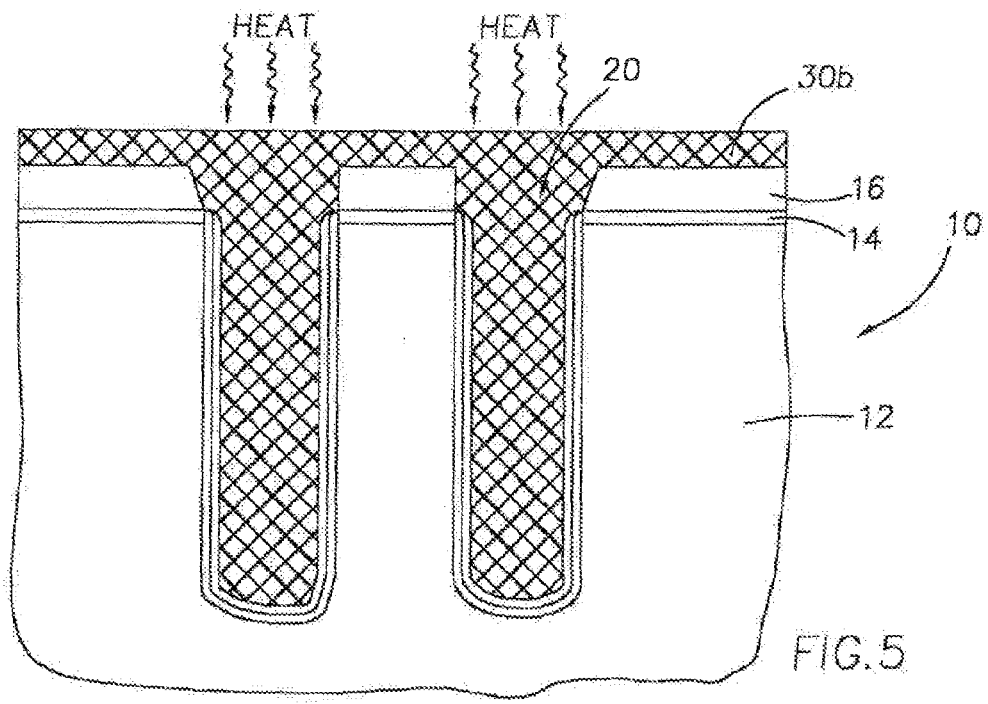

As depicted in FIG. 5, after coating, the substrate is heated to dry the polysilazane coating layer 30a by removing the organic solvent and produce a solid-phase polysilazane layer 30b. The coated film can be dried, for example, by baking the substrate on a hotplate at about 75° C. to about 350° C., preferably at about 150° C. to about 200° C., typically for about 1 to about 3 minutes. The resulting "as spun" or "spin-filled" polysilazane film without densification has non-uniform wet etch properties, typically exhibiting a very high etch rate in fluoride-based etch chemistries with significant non-uniformity that may be related to redox sensitivity and/or high selectivity between different regions of the layer.

Figure 6:
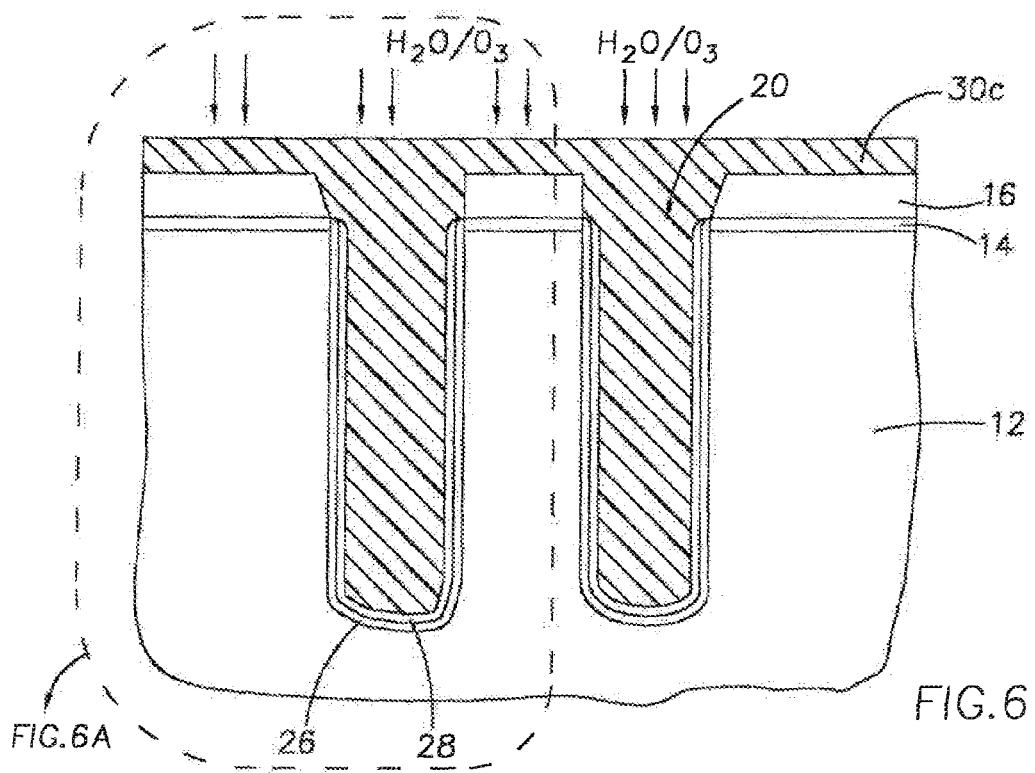

Referring now to FIG. 6, to increase its etch resistance in a subsequent processing step, the dried polysilazane coating 30b is treated (cured) to modify it to a silicon oxide layer 30c and provide a densified layer. According to the invention, a controlled low temperature, wet chemical oxidation of the polysilazane coating layer 30b is conducted to modify the chemical composition to form an —Si—O—Si— network structure and substantially fully oxidize the polysilazane layer 30b into an oxide of silicon. Preferably, the chemical transformation decreases the nitrogen (N) % and hydrogen (H %), and the resulting oxidation increases the oxygen (O) % content of the layer close to a $SiO_2$ composition.

In this step, the polysilazane layer 30b is subjected to a wet oxidation chemistry to oxidize the polysilazane groups $Si_x$-$N_yH_z$ of the polysilazane material 30b by replacing nitrogen and hydrogen atoms with oxygen atoms to form the layer into an oxygen rich material 30c, i.e., a silicon oxide, and primarily silicon dioxide ($SiO_2$). The polysilazane-based silicon oxide is preferably treated by a wet oxidation in the presence of ozone ($O_3$), or alternatively in a Standard Clean 1 (SC1; a dilution of $NH_4OH/H_2O_2$) or a Standard Clean 2 (SC2; a dilution of $HCl/H_2O_2$), such that more than about 80% of N and H are replaced in the upper 200-1500 Å of the polysilazane layer, as can be determined by XPS % atomic analysis and/or SIMS depth profiling analysis.

The replacement of Si—N, N—H and Si—H bonds with —Si—O—Si— bonds decreases the etch rate by different etch chemistries and improves uniformity of the etch. This modification results in a layer that can be uniformly, reproducibly, and controllably etched back to shape the structure, for example, by applying a fluoride-based etchant whereby the structure is etched at an etch rate of less than about 200 Å/minute, preferably in the about 10-20 Å/minute range, similar to thermal oxide, as can be demonstrated by SEM imaging to show a relatively uniform etch back. Exemplary fluoride-based etchants include a fluoride-containing, non-aqueous, isopropyl alcohol (IPA)-based etch solution, a non-aqueous $NH_4F:HF$ etch solution, and a solution comprising about 0.01-2% HF. Typically, the polysilazane layer 30b exhibits a volume shrinkage of an about 10% to about 15% decrease in thickness during the oxidation processing to form the silicon oxide layer 30c.

Figure 6A:
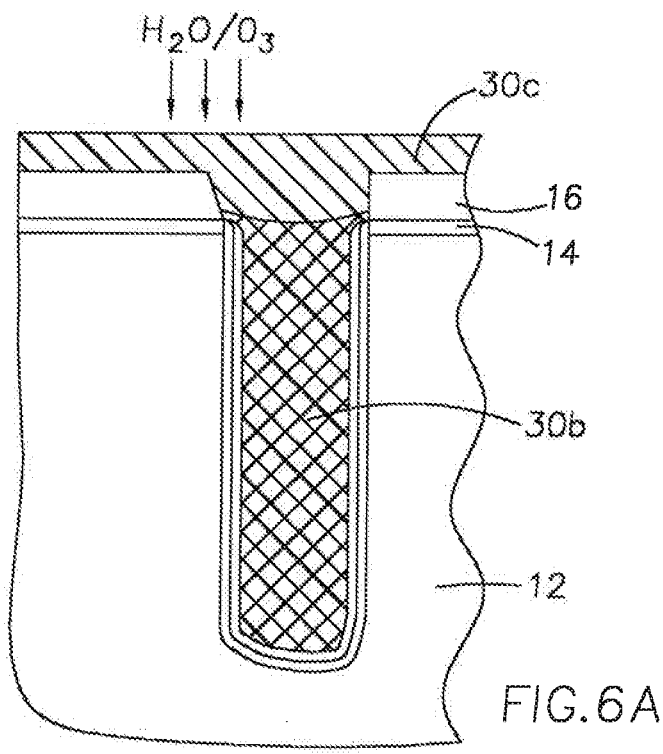
FIG. 6A illustrates another embodiment of a structure resulting from a wet oxidation processing step.

Referring now to FIG. 6A, in a high aspect ratio structure such as a trench, it can be difficult to diffuse oxygen into the polysilazane layer in the deeper part of the structure. With the wet oxidation process, an upper portion of the polysilazane layer 30a is oxidized nearly quantitatively to silicon dioxide ($SiO_2$) with little residual N being left in the oxidized portion. This tends to prevent oxygen from diffusing into the underlying region beyond the fully oxidized layer (zone) such that the polysilazane layer 30b in a deeper part of the trench is oxidized more restrictively (partially oxidized) where the oxygen (O) concentration is decreasing and the nitrogen (N) concentration is increasing. Thus, the formation of a silicon oxide layer is self-limiting.

Figure 7:
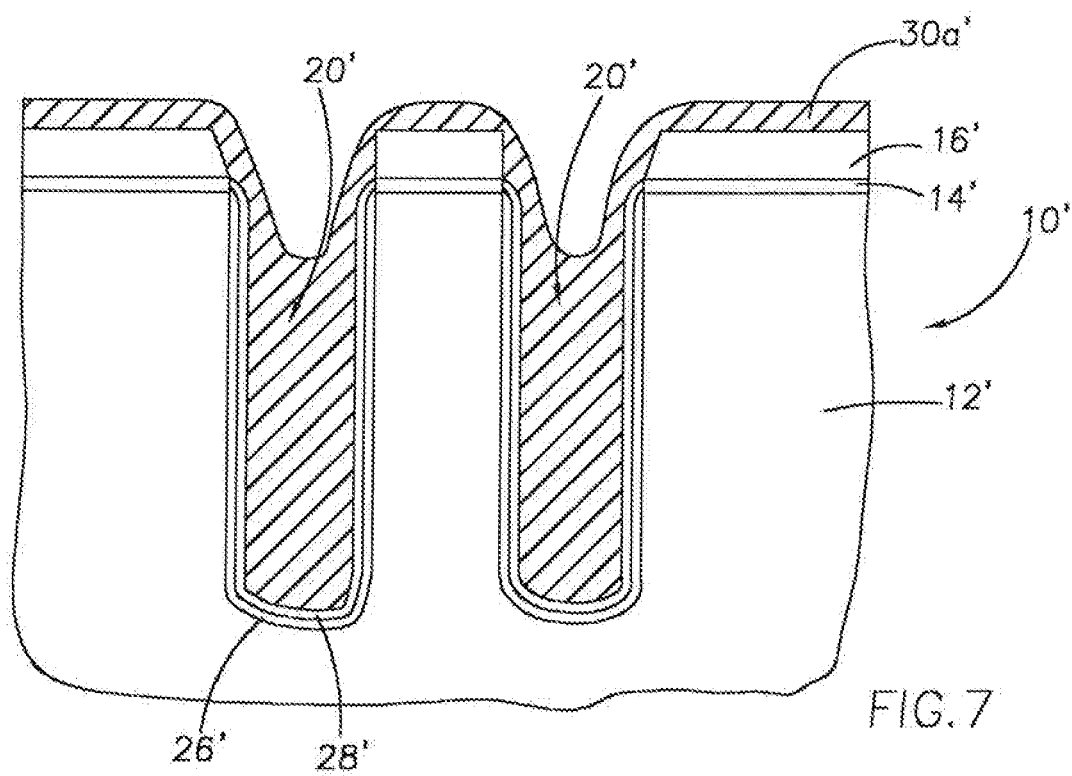
FIG. 7-9 are diagrammatic cross-sectional views of a fragment of a semiconductor wafer substrate at sequential processing steps in the fabrication of a trench isolation structure according to another embodiment of the method of the invention involving the processing of a thin polysilazane layer on the substrate.
Figure 8:
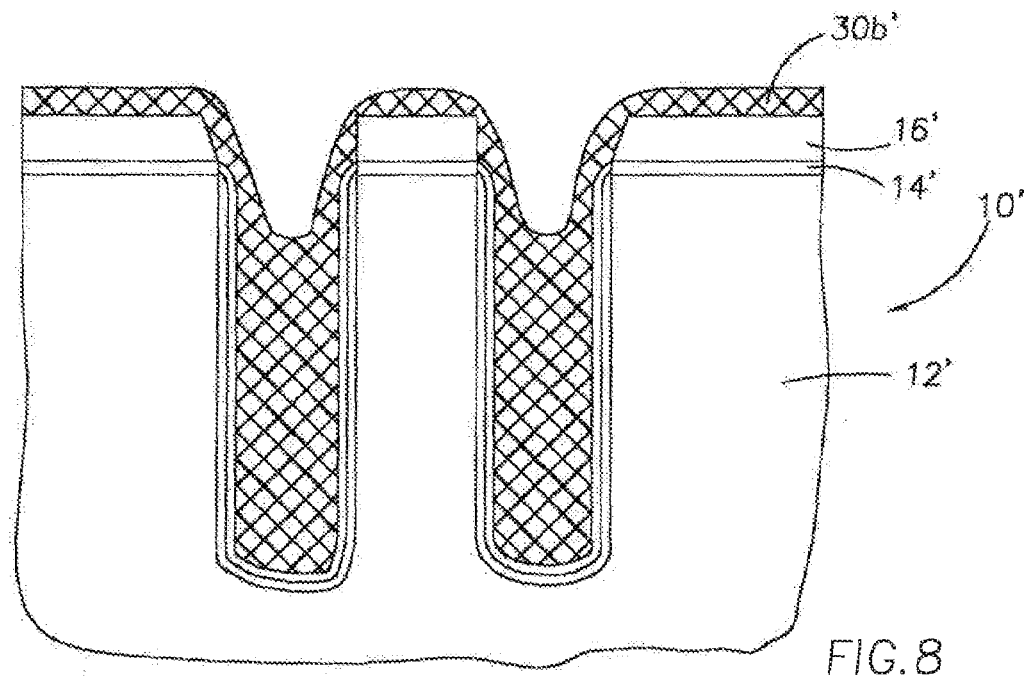

FIG. 6A depicts the deposition and oxidation of a medium coating of polysilazane of about 200-300 nm thick on the substrate. Another embodiment is depicted in FIGS. 7-9 illustrating the deposition of a thin coating of polysilazane 30a' of about 50-100 nm thick, the drying of the layer 30a' to a solid-phase layer 30b', and a low temperature/wet oxidation forming a top layer of silicon oxide 30c'.

Oxygen penetration into the polysilazane layer 30b, 30b' is typically to a depth of about 500-1500 Å (50-150 nm), and preferably to a depth of at least about 900 Å (90 nm) of a 50-5000 Å (50-500 nm) thick layer, with a decreasing oxygen profile thereafter. If the polysilazane layer is not completely oxidized, hydrogen and nitrogen remain in the material resulting in a porous layer, which is unstable and unreliable in a subsequent wet etch process step, which can be used to shape the layer to form a recessed trench fill, for example.

Figure 9:
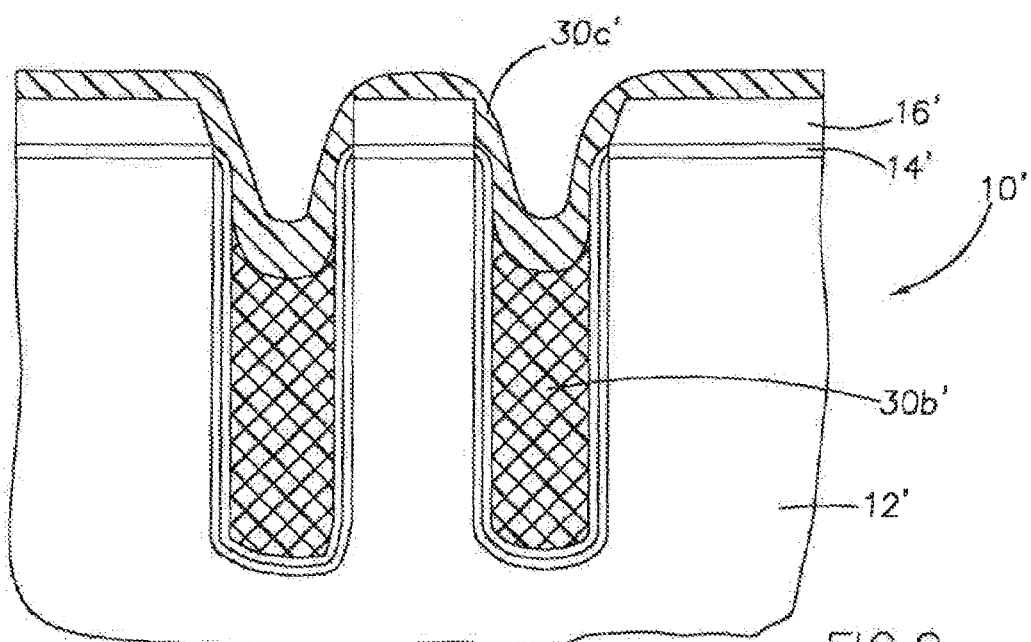

As depicted in FIGS. 6A and 9, where the thickness of the silicon oxide layer 30c, 30c' is not adequate for it to function as a STI structure or for interlayer isolation, and the thickness of the layer 30c, 30c' cannot be increased by further wet oxidation processing, the structure can be further processed to increase the thickness of silicon oxide within the trench.

Figure 10:
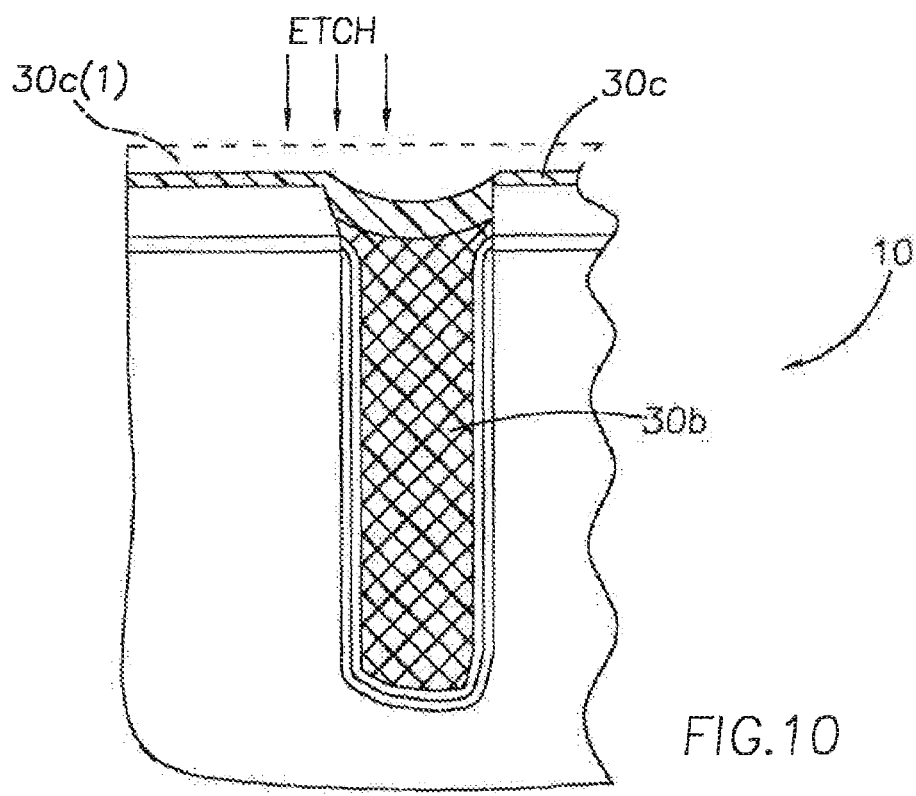
FIGS. 10-12 are diagrammatic cross-sectional views of the semiconductor wafer substrate shown in FIG. 6A at subsequent processing steps involving an etch back step and a low temperature/wet oxidation according to the invention, and the coating and processing of an additional polysilazane layer to increase the thickness of the silicon oxide layer to form a trench isolation structure.

For example, with respect to the structure depicted in FIG. 6A, in an optional step, a CMP or etch-back (wet or dry) can be conducted to remove or recess about 20-100 nm of a top portion 30c(1) of the silicon oxide layer 30c as shown in phantom (by dashed line - - - ) in FIG. 10. The silicon oxide layer 30c can be etched, for example, by application of a wet etch solution for a controllable etch back, such as a non-aqueous fluoride-containing etch solution, an $NH_4F$-based etch reagent, or a dilute solution of hydrofluoric acid (HF), or, although not preferred, by means of a reactive ion etching (RIE) process using an etch gas such as $CF_4$ and $CHF_3$.

Figure 11:
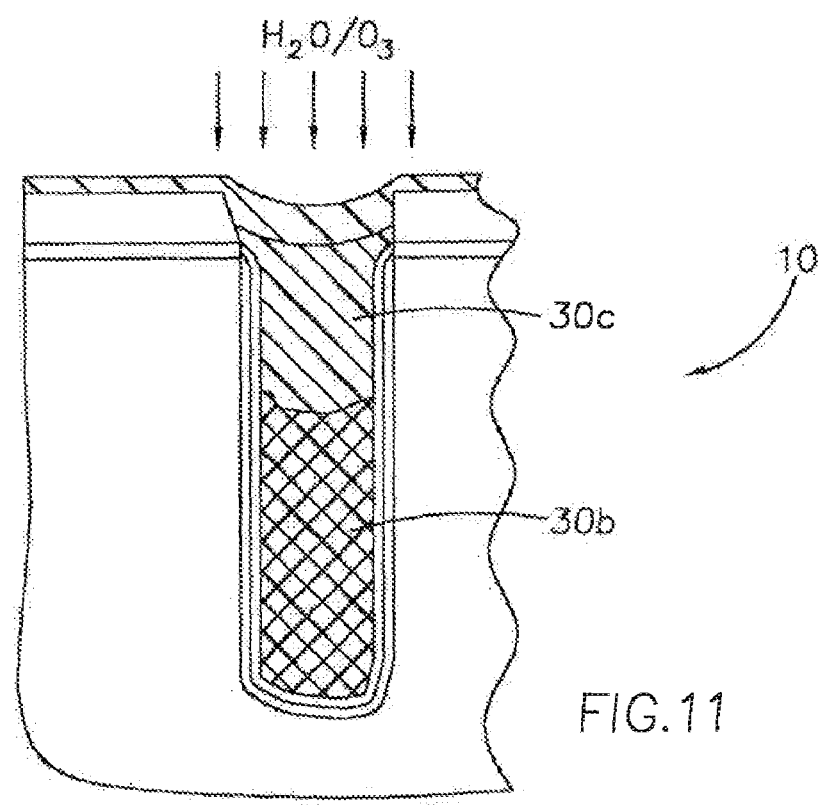

Referring now to FIG. 11, a low temperature/wet oxidation step can then be performed to oxidize an additional portion of the polysilazane layer 30b to increase the depth (thickness) of the insulating silicon oxide layer 30c within the trench.

Figure 12:
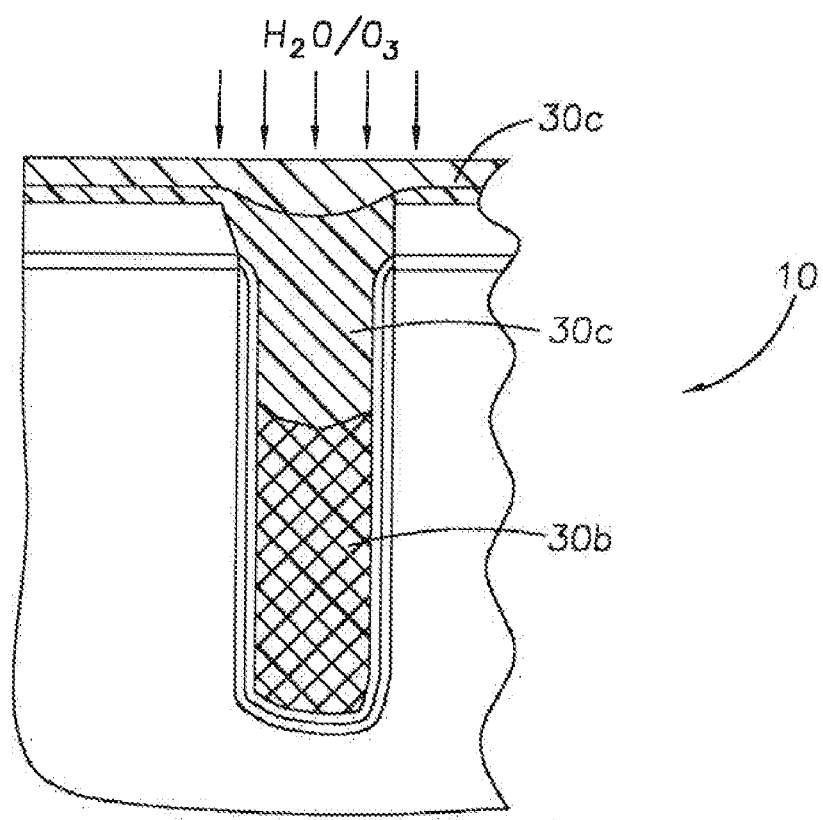

An additional thin coating of polysilazane can then be applied and processed by wet oxidation according to the invention to a silicon oxide layer 30c to increase the overall thickness of the silicon oxide layer, as shown in FIG. 12.

Figure 13:
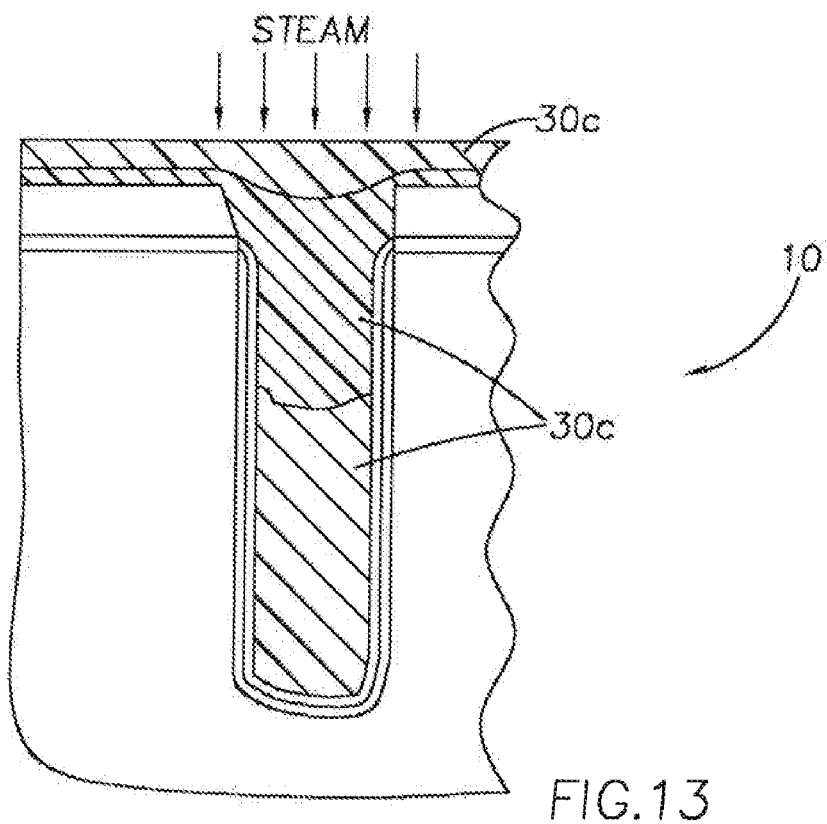
FIG. 13 illustrates a cross-sectional view of the substrate shown in FIG. 12 at a subsequent processing step involving a steam treatment to convert the polysilazane material to silicon oxide throughout the depth of the layer.

As a wet oxidation treatment is typically limited to oxidizing the top portion of the layer, in an optional processing step, a steam treatment can be utilized to provide a substantially complete conversion of the polysilazane (or SOD) to $SiO_2$ throughout the depth of the layer, as depicted in FIG. 13. The steam treatment comprises, for example, reacting hydrogen ($H_2$) and oxygen ($O_2$) together to form water vapor that is then introduced into a reaction chamber for contact with the polysilazane (or SOD) layer, or reacting the $H_2$ and $O_2$ together directly at the surface boundary layer. The processing temperature is generally about 125° C. to about 1,100° C., and the process duration is about 10 minutes to 120 minutes.

Figure 14:
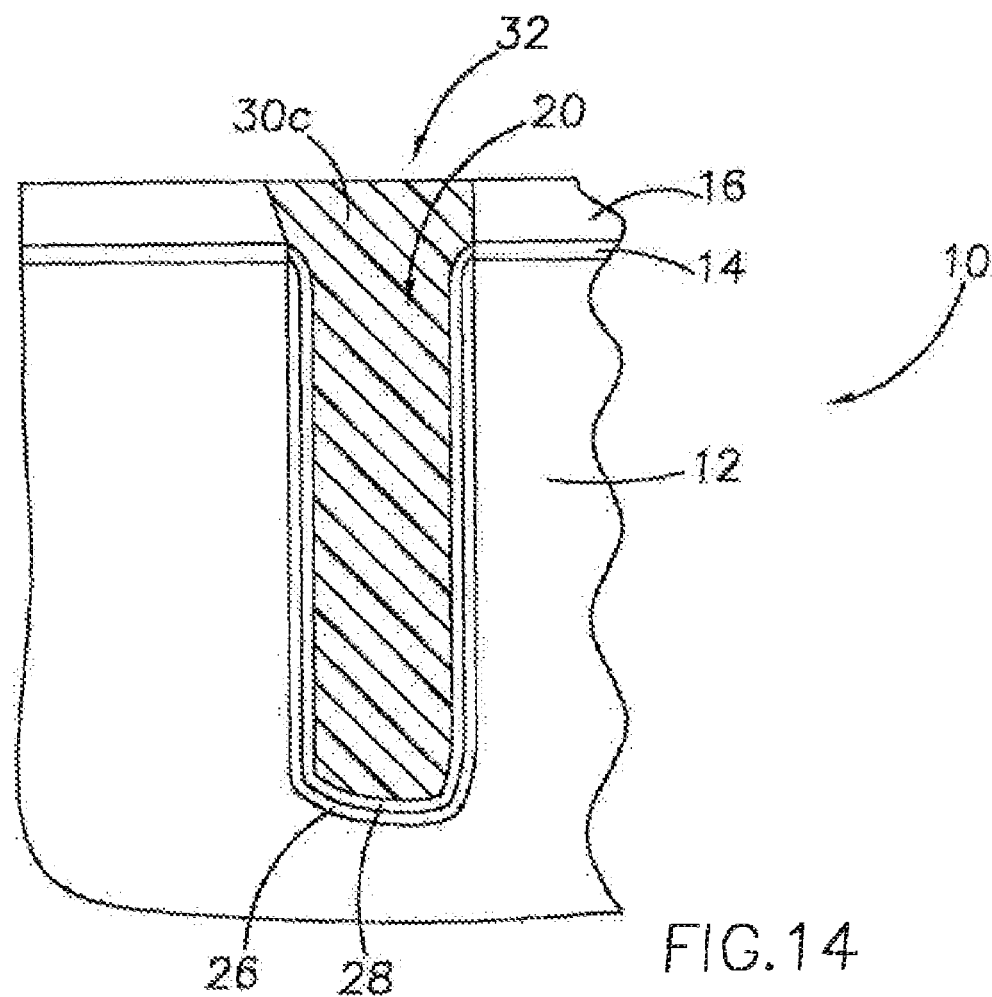
FIG. 14 is an illustrative cross-sectional view of the semiconductor wafer of FIG. 13 at a subsequent processing step of a CMP or etch back to form a trench isolation structure.

After formation, the silicon oxide layer 30c can be planarized by CMP, etch back, and the like, as shown in FIG. 14 to complete the trench isolation structure 32 by removing a portion of the silicon oxide isolation layer 30c filling the trench to be level with the substrate 12. A gate or other structure can then be fabricated according to known techniques.

Thus, an exemplary shallow trench isolation structure 32 depicted in FIG. 14, includes substrate 12, pad oxide layer 14, hard mask ($Si_3N_4$) layer 16, shallow trench 20, silicon oxide layer 26, optional silicon nitride liner 28, and polysilazane-based silicon oxide fill layer 30c.

The steps of depositing a polysilazane coating and conducting the low temperature/wet oxidation step, can be repeated and/or combined with optional processing steps such as an etch back step, CMP, and/or steam treatment, for example, to achieve the desired structure of a silicon oxide layer within the trench.

Figure 15:
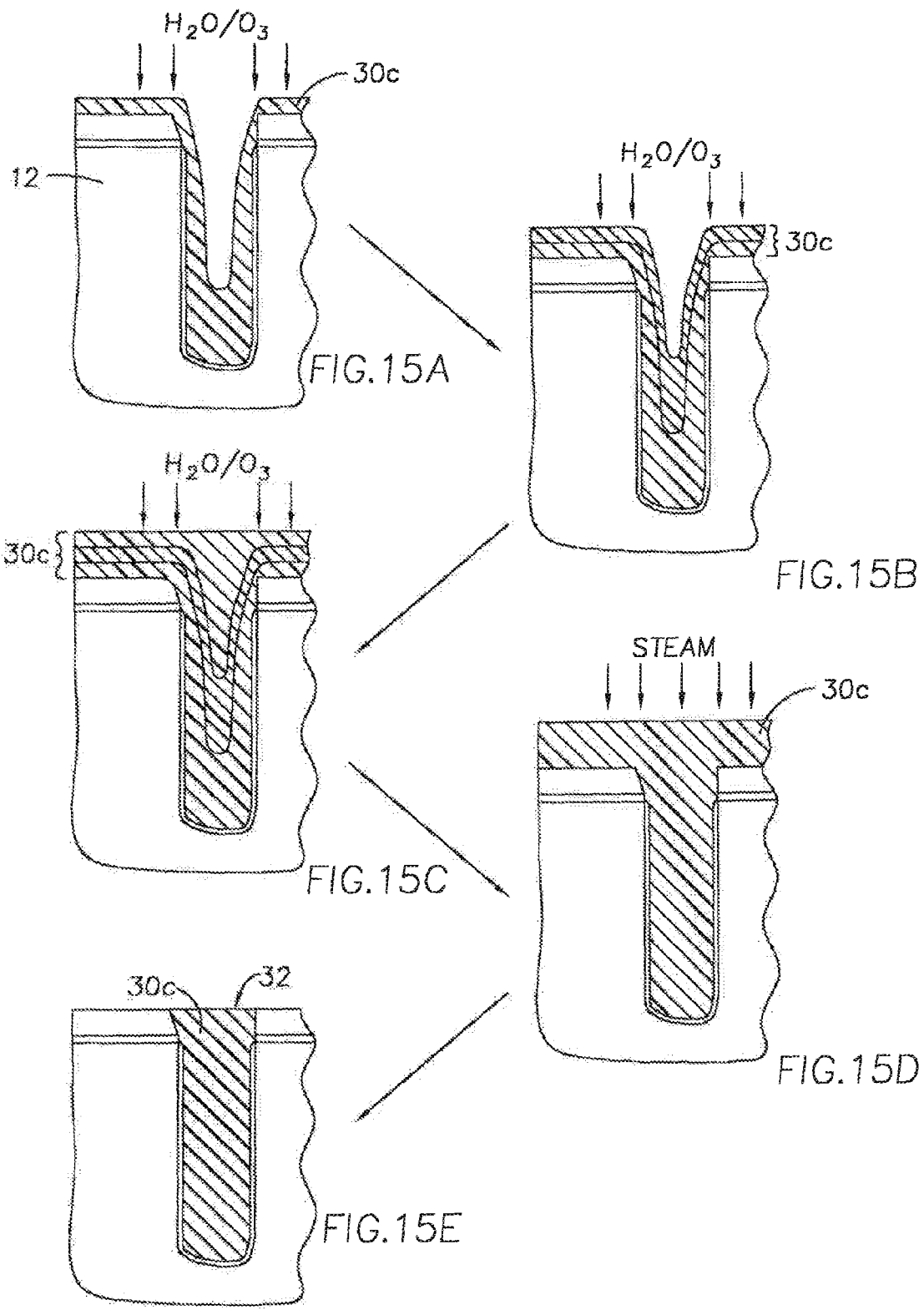
FIG. 15A-15E are diagrammatic cross-sectional views of a fragment of a semiconductor wafer substrate at sequential processing steps showing fabrication of a trench isolation structure according to another embodiment of the method of the invention involving repeated deposition of a thin polysilazane coating and wet oxidation to form a silicon oxide fill within the trench.

For example, as illustrated in FIGS. 15A-15C, in forming an STI structure, a thin coating of polysilazane solution can be spin coated on the surface of the substrate 12 to partially fill a trench 20, the polysilazane layer (30a) can be baked to remove the solvent, the dried layer (30b) treated by the low temperature/wet oxidation to convert it to a silicon oxide layer 30c, and then the steps can be repeated to coat additional layers of polysilazane thereon, each of which are dried and wet oxidized according to the invention, to increase the total thickness of silicon oxide 30c within the trench. As further illustrated in FIGS. 15D-15E, the structure can also be steam treated to oxidize the trench structure throughout the depth, and then planarized to form the isolation trench structure 32.

The following TABLE provides several non-limiting examples of integration schemes that can be utilized according to the invention.

| Example 1 | Example 2 | Example 3 | Example 4 |
|---|---|---|---|
| Apply thin coat (50-100 nm) of polysilazane | Apply medium coat (200-300 nm) of polysilazane | Apply medium coat (200-300 nm) of polysilazane | Apply thick coat (300-500 nm) of polysilazane |
| DI/ozone treatment | DI/ozone treatment | DI/ozone treatment | Steam treatment |
| Apply thin coat (50-100 nm) of polysilazane | Apply thin coat (50-100 nm) of polysilazane | Etch (dry or wet) | CMP |
| DI/ozone treatment | Steam treatment | Apply thin coat (50-100 nm) of polysilazane | DI/ozone treatment |

-continued

| Example 1 | Example 2 | Example 3 | Example 4 |
|---|---|---|---|
| Apply thin coat (50-100 nm) of polysilazane | CMP | DI/ozone treatment | Gate sequence |
| Steam treatment | DI/ozone treatment | Apply thin coat (50-100 nm) of polysilazane | |
| CMP | Gate sequence | Steam treatment | |
| Gate sequence | | CMP | |
| | | Gate sequence | |

Thus, the coating step and low temperature, wet oxidation step, with optional processing steps, can be conducted as desired to produce an optimal silicon oxide structure.

The low temperature/wet oxidation step can be performed at various points of fabrication where a processing step such as an etch back, patterning, or planarization (CMP) is performed which exposes an undensified polysilazane material layer (or dielectric, e.g., SOD, having a lower oxygen content than $SiO_2$), which can be oxidized according to the process of the invention.

Wet chemistries

Suitable wet chemistries that can be used to modify the polysilazane layer include a deionized water and ozone (DI/$O_3$) treatment, and or Standard Clean 1 (SC1) consisting of a dilution of ammonium hydroxide/hydrogen peroxide ($NH_4OH/H_2O_2$) followed by a deionized (DI) water rinse (about 20-30 minutes at about 55° C.-75° C.), or a Standard Clean 2 (SC2) which is a hydrochloric acid/hydrogen peroxide ($HCl/H_2O_2$) solution followed by a DI water rinse, with a DI/$O_3$ treatment being preferred and more controllable to oxidize polysilazane.

In one embodiment, the dried polysilazane layer 30b is exposed to an oxygen source in a spin and spray process in which the wafer is spun at a desired velocity while spraying a thin layer of water, preferably less than about 1 mm thick, onto the surface in an oxygen-enriched ambient. In a preferred embodiment, ozone ($O_3$) is utilized, but the oxygen ambient can also comprise oxygen ($O_2$), $NO_2$, $N_2O$, and the like, alone or preferably in combination with ozone. The water is maintained as a thin layer on the surface of the wafer so as to facilitate the movement and diffusion of oxygen into the polysilazane material layer 30b.

Figure 16:
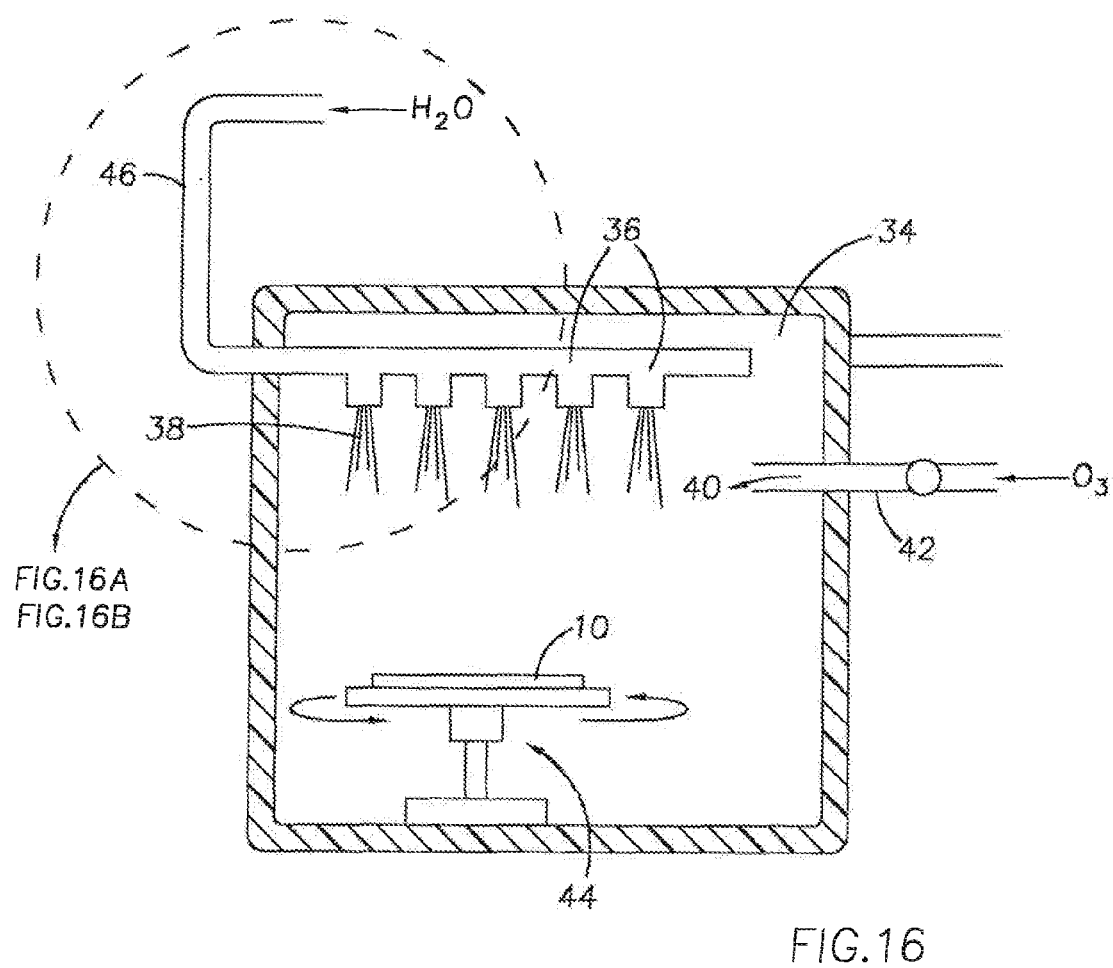
FIG. 16 is a schematic diagram of an embodiment of a spin and spray system for delivering an ozone-rich water solution onto a substrate according to the invention.

By way of example as illustrated in FIG. 16, the wafer 10 can be positioned in a reaction chamber 34 having an array of spray nozzles 36 for dispensing a spray of deionized (DI) water 38 through an ozone ($O_3$) ambient 40 that is continuously flowed through a gas inlet 42 into the chamber, to deposit a thin layer of ozone-rich deionized water onto the surface of the wafer 10 and the polysilazane layer while rotating the wafer using a spin tool 44. Ozone gas can be fed through inlet 42 into the chamber to provide an ozone concentration within the chamber 34 which is preferably at an about 50% to about 100% of the saturation level at the process temperature that is utilized (saturation in water being about 12 ppm at 30° C.). The ozone concentration in the reaction chamber 34 can range from about 0.01 ppm to about 1,000 ppm, preferably about 0.1 ppm to about 100 ppm, preferably about 1 ppm to about 12 ppm. An exemplary flow rate of ozone into the chamber is about 10 sccm to about 1,000 sccm. Preferably, the ozone/water solution deposited onto the wafer is a supersaturated solution whereby the water contains ozone above the water's normal ozone concentration capacity. The water can be applied using a steady stream or by pulse spraying.

Figure 16A:
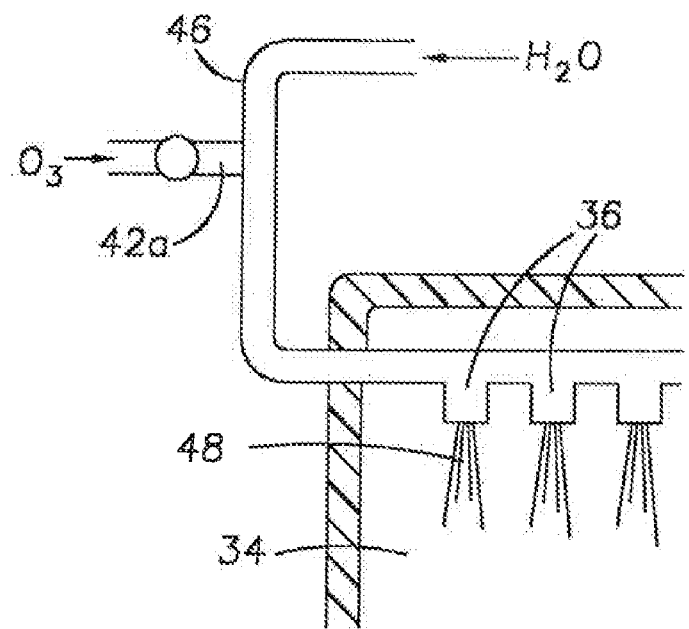
FIGS. 16A-16B are partial schematic diagrams of other embodiments of a spin and spray system shown in FIG. 16.
Figure 16B:
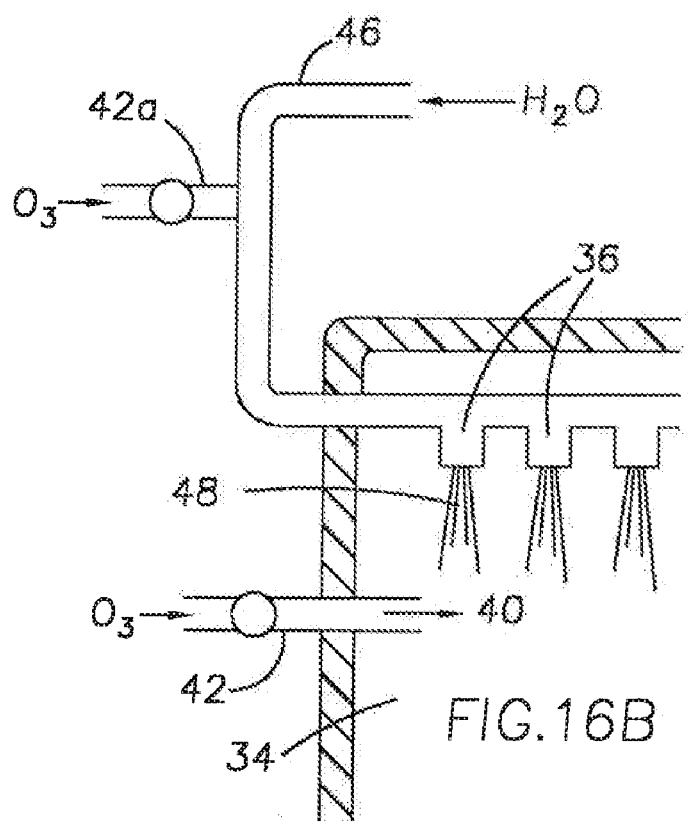

In another embodiment depicted in FIG. 16A, ozone gas 40 can be fed through an inlet 42a directly into the water inlet 46 to create a water mixture 48 containing the ozone at a saturation level of about 50% to about 100% (or about 4 ppm to about 15 ppm ozone) depending on the process temperature, which is then sprayed onto the wafer. In yet another embodiment, shown in FIG. 16B, the ozone gas 40 can be fed through an inlet 42a into the water inlet 46 and also directly into the chamber 34 through an inlet 42.

The reaction chamber, wafer and water temperatures can be maintained at room ambient temperature of about 20-30° C. or less, to up to about 100° C., preferably at about 70-90° C. The wafer can be heated for example, on a hot plate, which can be part of the spin tool 44. A preferred pressure of the reaction chamber is atmospheric (~1 atm) (room ambient).

The wafer 10 is rotated at a velocity that is adequate to maintain a uniformly thin layer of ozone-rich water on the surface of the wafer to facilitate transport (diffusion) of ozone to the polysilazane layer on the wafer. The velocity of the spinning wafer controls the thickness of the layer of water on the surface of the wafer, at least in part. The rotation velocity (spin rate) can range from about 10 to about 1,000 revolutions per minute (rpm), and is preferably about 50 rpm to about 600 rpm.

The wet oxidation of the polysilazane layer tends to produce a virtually self-limiting thickness growth or transformation of polysilazane layer 30b to a silicon oxide layer 30c since ozone is not capable of adequately diffusing through the growing silicon oxide layer to react with the underlying polysilazane layer. Thus, time is not a very critical factor in the processing of the polysilazane layer. Depending on the kinetics of the oxidation process, the processing time can range from a few seconds to several hours. Exemplary processing times are about 60 minutes to oxidize a 700-1000 Å (70-100 nm) thick polysilazane layer to $SiO_2$, and up to 8 hours to partially oxidize a 2000 Å (200 nm) thick layer.

Thickness of the silicon oxide layer generally increases over time. A preferred processing time is about 10 minutes to about 100 minutes. The ultimate thickness of a silicon oxide layer 30c produced by the oxidation process step is typically about 500 Å to about 2000 Å (about 50-200 nm). Chemical bonding information and oxidation depth measurement can be evaluated by XPS % atomic analysis and SIMS depth profiling analysis showing an oxygen profile of the film (i.e., decrease in nitrogen (N) %, increase in oxygen (O) %), with the surface composition and a depth to about 50-150 nm showing nearly two O atoms per Si atom.

In another embodiment, a pressurized system can optionally be utilized in order to process the polysilazane layer at a higher temperature. For example, the dried polysilazane layer 30b can be exposed to steam in the presence of ozone at a temperature of about 100-200° C. and a pressure of about 0.5-20 atm to produce the silicon oxide layer 30c. The exposure to the steam is such that a thin layer of water is formed on the surface of the polysilazane layer to facilitate diffusion of ozone into the layer. In another embodiment of such a system, the polysilazane layer 30b can be wet oxidized in the presence of ozone at a temperature of about 100-200° C. and a pressure of about 0.5-20 atm to produce the silicon oxide layer.

Figure 17:
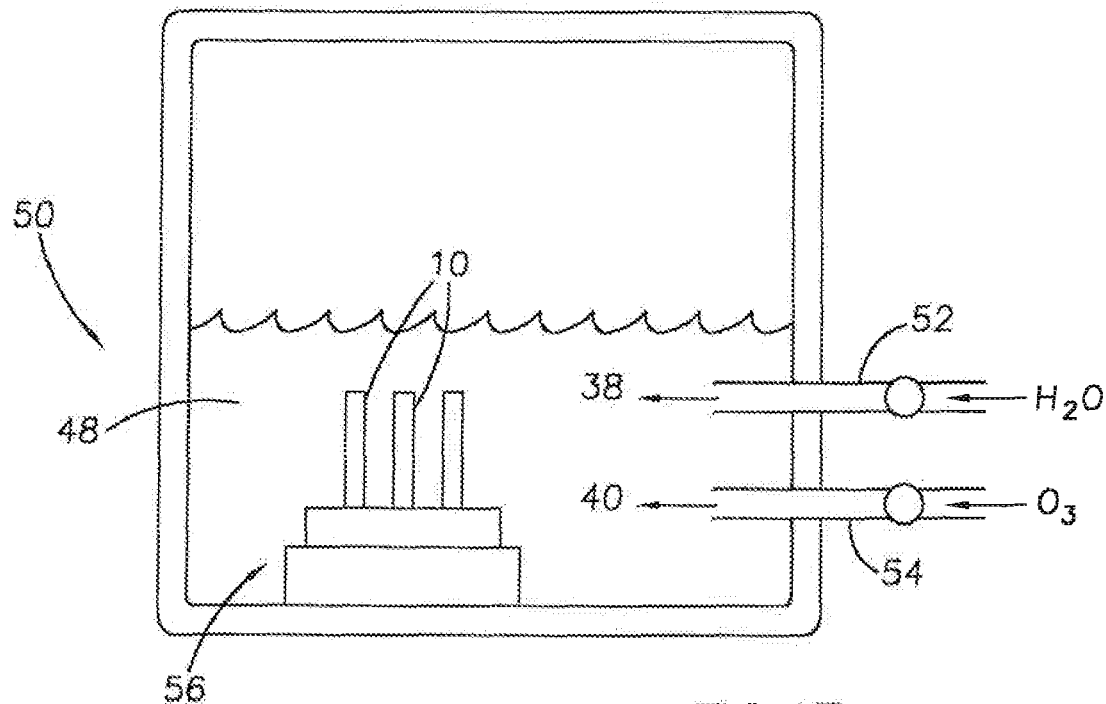
FIG. 17 is a schematic diagram of an embodiment of an immersion system for applying an ozone-rich water solution onto a substrate according to the invention.

Referring now to FIG. 17, in another embodiment of a method according to the invention, the wafer 10 can be immersed in a water bath or immersion tank 50 containing ozone-enriched deionized water mixture 48 such that the water is in contact with the polysilazane layer (30b) on the wafer 10. Preferably, the water mixture 48 contains about 2-15 ppm ozone ($O_3$), preferably an amount of ozone at or above the saturation point (i.e., 12 ppm ozone at 30° C.). The water temperature can be maintained at room ambient temperature of about 20-30° C., or less, to up to about 100° C., preferably at about 90° C.

For example, deionized water 38 can be introduced through water inlet 52 into a mixing apparatus or bath/tank 50, and ozone gas 40 can be continuously injected through gas inlet 54 directly into the water 38 at a predetermined pressure and flow rate. The wafer 10 is then immersed into the deionized water/ozone solution 48. The wafer can be mounted in a carrier 56 and/or a device that functions to rotate or move the wafer within the water for continuous movement and contact with the ozone/water solution.

In yet another embodiment, ozonated water can be introduced through water inlet 52, with the additional injection of ozone into the water being employed as needed, to provide an $O_3$ level in the water mixture 48 at about 2-15 ppm $O_3$, preferably an $O_3$ level at or above the saturation point.

Insulating interlayer structure

Figure 18:
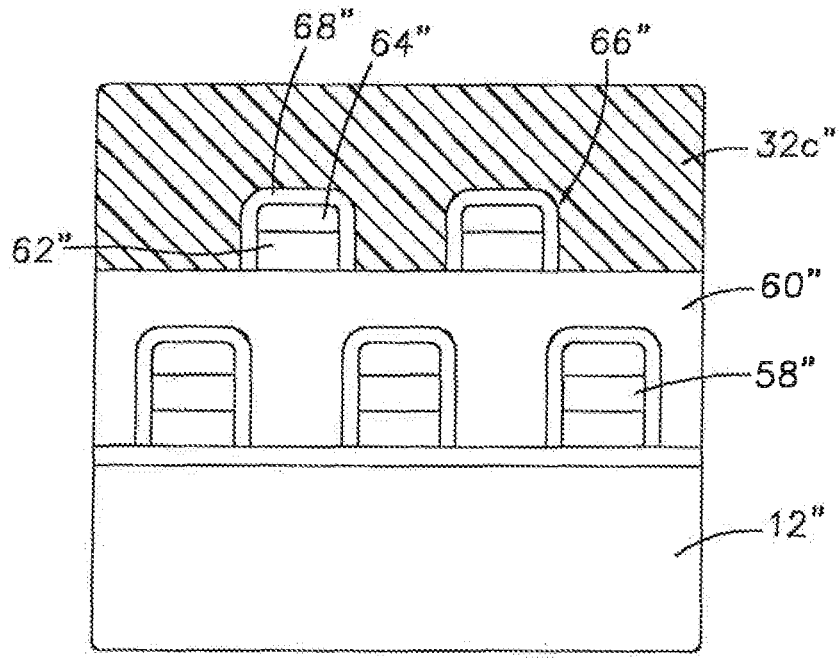
FIGS. 18-19 are diagrammatic cross-section views of a fragment of a semiconductor wafer substrate at sequential processing steps showing fabrication of an interlevel dielectric layer according to another embodiment of the method of the invention.
Figure 19:
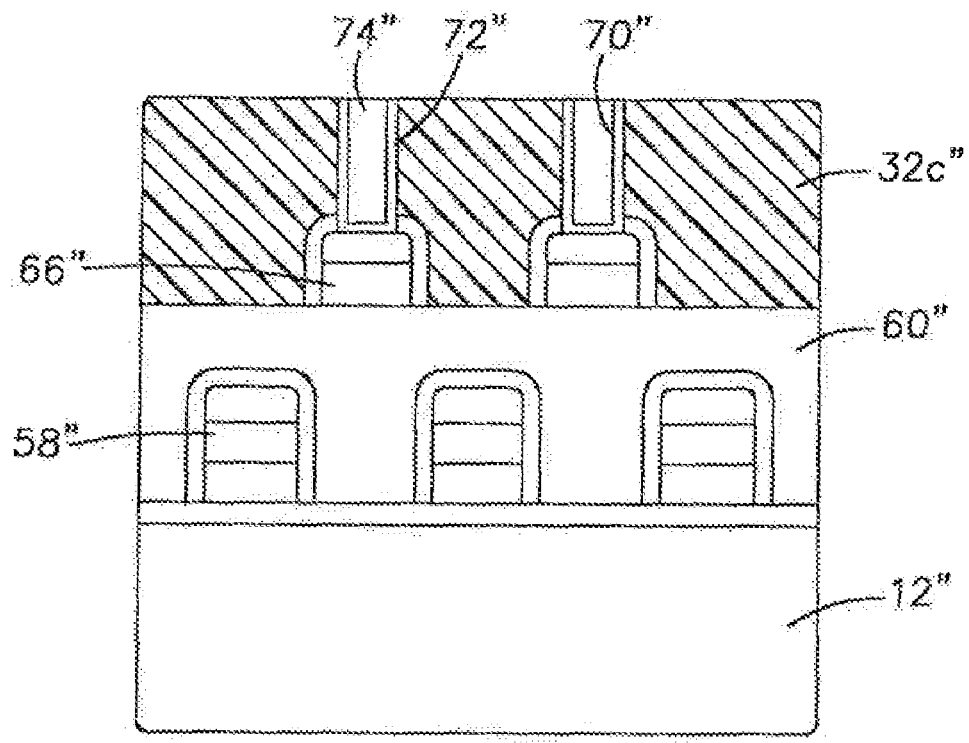

FIGS. 18-19 illustrate another embodiment of a method for forming a dielectric layer an insulating interlayer that can be formed on the surface region of a silicon substrate over semiconductor elements such as transistors, resistors, capacitors, and the like, for electrically isolating active devices in an integrated circuit from one another.

As shown in FIG. 18, a transistor 58" has been formed on the substrate 12", a BPSG film 60" having a thickness of about 500 nm has been formed over the transistor, a metal layer 62" (e.g., aluminum) has been formed on the BPSG layer, a titanium nitride (TiN) barrier layer 64" has been sputtered onto the metal layer 62", and a wiring layer 66" made of the metal layer 62" and TiN barrier layer 64" has been formed by etching. Optionally, as shown, a silicon oxide film 68" has been deposited onto the wiring layer 66", for example, by plasma CVD using a silane-based chemistry.

A silicon-containing polymer solution, as exemplified by polysilazane, is spin-coated onto the silicon oxide film 68" (or directly onto the wiring layer 66") to form a polysilazane coating layer, which is soft baked to remove the solvent to form a solid-phase polysilazane layer, and then subjected to a low temperature/wet oxidation according to the invention to oxidize the polysilazane material, resulting in a silicon oxide layer 32c", as shown in FIG. 18.

Referring now to FIG. 19, a contact opening 70" can then be formed through the polysilazane-based silicon oxide layer 32c" to the wire layer 66" by photolithography, a TiN insulating layer 72" deposited onto the walls of the opening 70", and a metal layer 74" such as tungsten (W), aluminum (Al) or copper (Cu), can be deposited over the TiN layer 72" to fill the opening 70", thus forming a contact to the underlying wire layer 66".

Thus, the silicon oxide layer produced from a polysilazane by the process of the invention can be used in various applications and fabrications, such as a fill in a trench isolation structure, as a protective insulation layer over a semiconductor or integrated circuit device, as a planarization layer, or as an inter-layer dielectric, among other structures and devices.

The process of the invention can also be used with other spin-on dielectrics (SODs) that have a lower oxygen content than $SiO_2$ such as a siloxane. The SOD material is spin coated as a layer 30a on the substrate 12, dried to form a solid phase dielectric layer 30b, and then processed according to the invention using a low temperature wet oxidation (deionized water/ozone process) as described herein to further oxidize the dielectric material to a silicon oxide (primarily silicon dioxide, $SiO_2$) material layer 30c. Exemplary SOD materials that can be processed according to the invention include methyl silsesquioxane, hydrogen silsesquioxane, and silicate, for example.

The process and structures are particularly suitable in the fabrication of various memory circuitry. Examples of memory circuitry include dynamic random-access (DRAM) structures which allow both writing and reading and which memory cells can be accesses in a random order independent of physical location, and read-only memory (ROM) devices such as FLASH memory which can be selectively erased rapidly through the use of an electrical erase signal. The process of the invention is also useful in fabricating isolation structures in integrated circuit designs that incorporate field effect transistors (FETs) that include a gate oxide layer formed on a wafer, a gate formed on the gate oxide layer, spacers beside the gate, doped source/drain (S/D) regions on respective sides of the gate, and shallow trench insulator (STI) regions that isolate adjacent transistors, including a FinFET device that uses two gates, one on each side of a fin body (i.e., transistor body) to facilitate scaling of CMOS dimensions.

Figure 20:
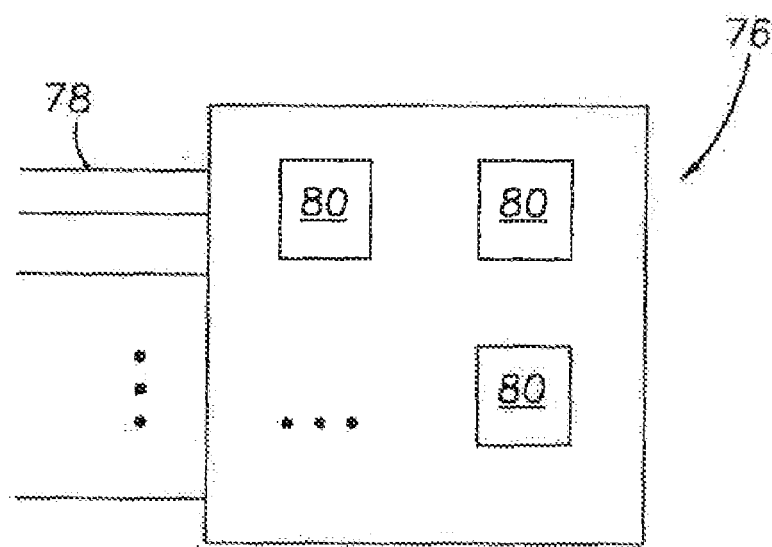
FIG. 20 is a block diagram of a circuit module according to an embodiment of the present invention.

FIG. 20 is a block diagram of an embodiment of a circuit module 76 in which the present invention can be incorporated. Such modules, devices and systems (e.g., processor systems) incorporating the module are described and illustrated in U.S. Pat. Nos. 6,437,417 (Gilton) and 6,465,828 (Agarwal), the disclosures of which are incorporated by reference herein. In brief, two or more dies may be combined into a circuit module 76 to enhance or extend the functionality of an individual die. Circuit module 76 may be a combination of dies representing a variety of functions, or a combination of dies containing the same functionality. One or more dies of the circuit module can contain circuitry, or integrated circuit devices, that includes at least one polysilazane-based silicon oxide layer in accordance with the embodiments of the present invention. The integrated circuit devices can include a memory cell that comprises a silicon oxide layer as discussed in the various embodiments in accordance with the invention.

Some examples of a circuit module include memory modules, device drivers (on a BIOS or EPROM), power modules, communication modems, processor modules, and application-specific modules, and may include multilayer, multichip modules. Circuit module 76 may be a subcomponent of a variety of electronic systems, such as a clock, a television, a cell phone, a personal computer, an automobile, an industrial control system, an aircraft, among others. Circuit module 76 will have a variety of leads 78 extending therefrom and coupled to dies 80 providing unilateral or bilateral communication and control.

The circuit module can be incorporated, for example, into an electronic system that comprises a user interface, for example, a keyboard, monitor, display, printer, speakers, etc. One or more circuit modules can comprise a microprocessor that provides information to the user interface, or is otherwise programmed to carry out particular functions as is known in the art. The electronic system can comprise, for example, a computer system including a processor and a memory system as a subcomponent, and optionally user interface components, and other associated components such as modems, device interface cards, etc. Examples of memory circuits include but are not limited to DRAM (Dynamic Random Access Memory), SRAM (Static Random Access Memory), Flash memories, a synchronous DRAM such as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging memory technologies.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a silicon oxide layer in a trench on a substrate, comprising:
    wet oxidizing a polysilazane layer situated on the substrate by spraying water onto the polysilazane layer in an ozone ambient at a temperature of less than about 100° C. to produce the silicon oxide layer.

2. The method of claim 1, wherein the silicon oxide layer is formed over active areas situated on the substrate.

3. A method of forming a silicon oxide layer in a trench on a substrate, comprising:
    wet oxidizing a polysilazane layer situated on the substrate by spraying a mixture of water and ozone onto the polysilazane layer at a temperature of less than about 100° C. to produce the silicon oxide layer having an etch rate of less than about 200 Å/minute in a fluoride-based etchant.

4. A method of forming a silicon oxide layer in a trench on a substrate, comprising:
    wet oxidizing a polysilazane layer situated on the substrate by immersing the substrate into water comprising ozone at a temperature of less than about 100° C. to produce the silicon oxide layer having an etch rate of less than about 200 Å/minute in a fluoride-based etchant.

5. A method of forming a silicon oxide layer in a trench on a substrate, comprising:
    wet oxidizing a polysilazane layer situated on the substrate by applying a solution of ammonium hydroxide/hydrogen peroxide followed by a deionized water rinse at a temperature of less than about 100° C. to produce the silicon oxide layer having an etch rate of less than about 200 Å/minute in a fluoride-based etchant.

6. A method of forming a silicon oxide layer in a trench on a substrate, comprising:
    wet oxidizing a polysilazane layer situated on the substrate by applying a solution of hydrochloric acid/hydrogen peroxide followed by a deionized water rinse at a temperature of less than about 100° C. to produce the silicon oxide layer having an etch rate of less than about 200 Å/minute in a fluoride-based etchant.

7. A method of forming a silicon oxide layer on a substrate, comprising:
    wet oxidizing a polysilazane layer situated on the substrate at a temperature of less than about 100° C. to produce the silicon oxide layer comprising $SiO_2$ and having an etch rate of less than about 200 Å/minute in a fluoride-based etchant.

8. The method of claim 7, wherein the etchant comprises about 0.01-2% HF.

9. The method of claim 7, wherein the etchant comprises a non-aqueous $NH_4F:HF$ etch solution.

10. A method of forming a silicon oxide layer on a substrate, comprising:
    applying water and ozone onto a polysilazane layer situated on the substrate at a temperature of less than about 100° C. to produce the silicon oxide layer having an etch rate of less than about 200 Å/minute in a fluoride-based etchant.

11. A method of forming a silicon oxide layer on a substrate, comprising:
    spraying a mixture of water and ozone onto a polysilazane layer on the substrate at a temperature of less than about 100° C. to produce the silicon oxide layer having an etch rate of less than about 200 Å/minute in a fluoride-based etchant.

12. A method of forming a silicon oxide layer on a substrate, comprising:
    spraying water onto a polysilazane layer situated on the substrate in an ozone ambient at a temperature of less than about 100° C. to deposit an ozone/water mixture onto the polysilazane layer to produce the silicon oxide layer.

13. A method of forming a silicon oxide layer on a substrate, comprising:
    immersing a substrate having a polysilazane layer situated thereon into water comprising ozone at a temperature of less than about 100° C. to modify the polysilazane layer to the silicon oxide layer having an etch rate of less than about 200 Å/minute in a fluoride-based etchant.

14. A method of forming a silicon oxide layer on a substrate, comprising:
    wet oxidizing an about 50-500 nm thick polysilazane layer situated on the substrate by exposing the polysilazane layer to water and ozone at a temperature of less than about 100° C. to produce the silicon oxide layer comprising $SiO_2$ and having a thickness of at least about 50 nm with an etch rate of less than about 200 Å/minute in a fluoride-based etchant.

15. A method of forming a silicon oxide layer on a substrate, comprising:
    wet oxidizing a polysilazane layer situated on the substrate at a temperature of less than about 100° C. to produce a silicon oxide layer;
    removing a portion of the silicon oxide layer; and
    wet oxidizing the silicon oxide layer at a temperature of less than about 100° C. to further oxidize the silicon oxide layer and polysilazane layer.

16. A method of forming a silicon oxide layer on a substrate, comprising:
    spin coating a polysilazane solution onto the substrate;
    drying the polysilazane solution to form a solid-phase polysilazane layer; and
    wet oxidizing the polysilazane layer by exposing the polysilazane layer to water and ozone at a temperature of less than about 100° C. to produce a silicon oxide layer with an etch rate of less than about 200 Å/minute in a fluoride-based etchant.

17. A method of forming a silicon oxide layer on a substrate, comprising:
wet oxidizing a polysilazane layer situated on the substrate at a temperature of less than about 100° C. to produce a silicon oxide layer;
removing a top portion of the silicon oxide layer; and
wet oxidizing the silicon oxide layer at a temperature of less than about 100° C. to further oxidize the silicon oxide layer, an additional thickness of the polysilazane layer, or a combination thereof.

18. A method of forming a silicon oxide layer on a substrate, comprising:
wet oxidizing a thickness of a polysilazane layer situated on the substrate at a temperature of less than about 100° C. to produce a silicon oxide layer;
removing a top portion of the silicon oxide layer; and
wet oxidizing the silicon oxide layer at a temperature of less than about 100° C. to further oxidize the silicon oxide layer and an additional thickness of the polysilazane layer.

19. The method of claim 18, further comprising:
forming a polysilazane layer on the silicon oxide layer; and
wet oxidizing the polysilazane layer at a temperature of less than about 100° C. to produce a silicon oxide layer.

20. The method of claim 18, further comprising:
forming a polysilazane layer on the silicon oxide layer; and
applying steam to oxidize the polysilazane layer and further oxidize the silicon oxide layer.

21. A method of forming a silicon oxide layer on a substrate, comprising:
forming a polysilazane layer on the substrate;
wet oxidizing the polysilazane layer at a temperature of less than about 100° C. to produce a silicon oxide layer; and
repeating forming and wet oxidizing a polysilazane layer to form the silicon oxide layer having a desired thickness.

22. The method of claim 21, further comprising:
depositing a layer of polysilazane onto the silicon oxide layer; and
applying steam to oxidize the polysilazane layer and further oxidize the silicon oxide layer.

23. A method of forming a silicon oxide layer on a substrate, comprising:
forming a polysilazane layer on the substrate;
applying steam to the polysilazane layer to form a silicon oxide layer;
planarizing the silicon oxide layer; and
wet oxidizing the silicon oxide layer at a temperature of less than about 100° C.

24. The method of claim 23, wherein planarizing comprises a chemical mechanical planarization process.

25. A method of forming a silicon oxide layer on a substrate, comprising:
forming a polysilazane layer on the substrate;
wet oxidizing the polysilazane layer at a temperature of less than about 100° C. to produce a silicon oxide layer;
removing a top portion of the silicon oxide layer;
forming a polysilazane layer on the silicon oxide layer; and
repeating wet oxidizing, removing and forming to form a desired thickness of the silicon oxide layer.

26. A method of forming a silicon oxide layer on a substrate, comprising:
sequentially and repeatedly forming a polysilazane layer over the substrate and wet oxidizing the polysilazane layer by exposing the polysilazane layer to water and ozone at a temperature of less than about 100° C. to produce the silicon oxide layer having a desired thickness, and after wet oxidizing the polysilazane layer, removing a portion of the silicon oxide layer prior to forming the polysilazane layer.

27. The method of claim 26, further comprising forming a polysilazane layer, applying steam to oxidize the polysilazane layer and further oxidize the silicon oxide layer.

28. The method of claim 26, further comprising planarizing the silicon oxide layer.

29. A method of forming a silicon oxide layer on a substrate, comprising:
wet oxidizing a polysilazane-based silicon oxide layer situated on the substrate in the presence of ozone to produce the silicon oxide layer, wherein at least about 80% of N and H are replaced in an upper 200-1500 Å of the polysilazane layer, as determined by XPS % atomic analysis, SIMS depth profiling analysis, or both.

30. A method of forming a silicon oxide layer on a substrate, comprising:
applying steam to a polysilazane-based silicon oxide layer situated on the substrate in the presence of ozone to produce the silicon oxide layer, wherein at least about 80% of N and H are replaced in an upper 200-1500 Å of the polysilazane layer, as determined by XPS % atomic analysis, SIMS depth profiling analysis, or both.

31. A method of forming a silicon oxide layer on a substrate, comprising:
wet oxidizing a polysilazane-based silicon oxide layer situated on the substrate by applying a solution of ammonium hydroxide/hydrogen peroxide followed by a deionized water rinse to produce the silicon oxide layer, wherein at least about 80% of N and H are replaced in an upper 200-1500 Å of the polysilazane layer, as determined by XPS % atomic analysis, SIMS depth profiling analysis, or both.

32. A method of forming a silicon oxide layer on a substrate, comprising:
wet oxidizing a polysilazane-based silicon oxide layer situated on the substrate applying a solution of hydrochloric acid/hydrogen peroxide followed by a deionized water rinse to produce the silicon oxide layer, wherein at least about 80% of N and H are replaced in an upper 200-1500 Å of the polysilazane layer, as determined by XPS % atomic analysis, SIMS depth profiling analysis, or both.

33. A method of forming a silicon oxide layer on a substrate, comprising:
steam oxidizing a polysilazane-based silicon oxide layer situated on the substrate in the presence of ozone at a temperature of about 100-200° C. and a pressure of about 0.5-20 atm to produce the silicon oxide layer having an etch rate of less than about 200 Å/minute in a fluoride-based etchant.

34. A method of forming a silicon oxide layer on a substrate, comprising:
wet oxidizing a polysilazane-based silicon oxide layer situated on the substrate in the presence of ozone gas at a temperature of about 100-200° C. and a pressure of about 0.5-20 atm to produce the silicon oxide layer having an etch rate of less than about 200 Å/minute in a fluoride-based etchant.

35. A method of treating a polysilazane layer situated in a trench on a substrate, comprising:

wet oxidizing the polysilazane layer by exposure to water and ozone at a temperature of less than about 100° C. to produce a silicon oxide layer having an etch rate of less than about 200 Å/minute in a fluoride-based etchant.

36. The method of claim 35, wherein the polysilazane layer is situated over an active area on the substrate.

37. A method of treating a polysilazane layer situated on a semiconductor substrate, comprising:
wet oxidizing the polysilazane layer at a temperature of less than about 100° C. to produce a silicon oxide layer having an etch rate of less than about 200 Å/minute in a fluoride-based etchant.

38. The method of claim 37, wherein the etchant comprises about 0.01-2% HF.

39. The method of claim 37, wherein the etchant comprises a non-aqueous $NH_4F$:HF etch solution.

40. A method of treating a polysilazane layer situated on a semiconductor substrate, comprising:
applying water and ozone onto the polysilazane layer at a temperature of less than about 100° C. to produce a silicon oxide layer having an etch rate of less than about 200 Å/minute in a fluoride-based etchant.

41. A method of treating a polysilazane layer situated on a semiconductor substrate, comprising:
spraying a mixture of water and ozone onto the polysilazane layer at a temperature of less than about 100° C. to produce a silicon oxide layer having an etch rate of less than about 200 Å/minute in a fluoride-based etchant.

42. A method of treating a polysilazane layer situated on a semiconductor substrate, comprising:
spraying water onto the polysilazane layer in an ozone ambient at a temperature of less than about 100° C. to deposit an ozone/water mixture onto the polysilazane layer to produce a silicon oxide layer.

43. A method of treating a polysilazane layer situated on a semiconductor substrate, comprising:
immersing the substrate into water comprising ozone at a temperature of less than about 100° C. to modify the polysilazane layer to a silicon oxide layer having an etch rate of less than about 200 Å/minute in a fluoride-based etchant.

44. A method of treating a polysilazane layer situated on a semiconductor substrate, comprising:
applying a solution of ammonium hydroxide/hydrogen peroxide onto the polysilazane layer followed by a deionized water rinse to produce a silicon oxide layer having an etch rate of less than about 200 Å/minute in a fluoride-based etchant.

45. A method of treating a polysilazane layer situated on a semiconductor substrate, comprising:
applying a solution of hydrochloric acid/hydrogen peroxide onto the polysilazane layer followed by a deionized water rinse to produce a silicon oxide layer having an etch rate of less than about 200 Å/minute in a fluoride-based etchant.

46. A method of treating a polysilazane-based silicon oxide layer situated on a substrate, comprising:
wet oxidizing the polysilazane-based silicon oxide layer by exposure to water and ozone,
wherein at least about 80% of N and H are replaced in an upper 200-1500 Å of the polysilazane layer, as determined by XPS % atomic analysis, SIMS depth profiling analysis, or both, and the silicon oxide layer has an etch rate of less than about 200 Å/minute in a fluoride-based etchant.

47. A method of treating a polysilazane-based silicon oxide layer situated on a substrate, comprising:
applying steam in the presence of ozone to wet oxidize the polysilazane-based silicon oxide layer, wherein at least about 80% of N and H are replaced in an upper 200-1500 Å of the polysilazane layer, as determined by XPS % atomic analysis, SIMS depth profiling analysis, or both, and the silicon oxide layer has an etch rate of less than about 200 Å/minute in a fluoride-based etchant.

48. A method of treating a polysilazane-based silicon oxide layer situated on a substrate, comprising:
wet oxidizing the polysilazane-based silicon oxide layer by applying a solution of ammonium hydroxide/hydrogen peroxide followed by a deionized water rinse, wherein at least about 80% of N and H are replaced in an upper 200-1500 Å of the polysilazane layer, as determined by XPS % atomic analysis, SIMS depth profiling analysis, or both.

49. A method of treating a polysilazane-based silicon oxide layer situated on a substrate, comprising:
wet oxidizing the polysilazane-based silicon oxide layer by applying a solution of hydrochloric acid/hydrogen peroxide followed by a deionized water rinse, wherein at least about 80% of N and H are replaced in an upper 200-1500 Å of the polysilazane layer, as determined by XPS % atomic analysis, SIMS depth profiling analysis, or both.

50. A method of treating a polysilazane-based silicon oxide layer situated on a substrate, comprising:
steam oxidizing the polysilazane-based silicon oxide layer in the presence of ozone at a temperature of about 100-200° C. and a pressure of about 0.5-20 atm.

51. A method of treating a polysilazane-based silicon oxide layer situated on a substrate, comprising:
wet oxidizing the polysilazane-based silicon oxide layer in the presence of ozone gas at a temperature of about 100-200° C. and a pressure of about 0.5-20 atm.

52. A method of treating a silicon oxide layer situated on a semiconductor substrate, comprising:
wet oxidizing the silicon oxide layer at a temperature of less than about 100° C. to increase the oxygen concentration, wherein the etch rate of the silicon oxide layer using fluoride-based etchant is less than about 200 Å/minute.

53. The method of claim 52, wherein the etchant comprises about 0.01-2% HF.

54. The method of claim 52, further comprising, prior to wet oxidizing, forming the silicon oxide layer by spin coating a polysilazane solution onto the substrate.

55. The method of claim 52, further comprising, prior to wet oxidizing, forming the silicon oxide layer by spin coating a flowable dielectric on the substrate.

56. The method of claim 55, wherein wet oxidizing comprises applying deionized water and ozone onto the silicon oxide layer.

57. The method of claim 55, wherein forming the silicon oxide layer comprises chemical vapor depositing a silane source gas and an oxygen source gas onto the substrate.

58. The method of claim 57, wherein the flowable dielectric is selected from the group consisting of methyl silsesquioxane, hydrogen silsesquioxane, and silicate.

59. A method of treating a silicon oxide layer, comprising:
wet oxidizing the silicon oxide layer by exposure to water and ozone, wherein at least about 80% of N and H are replaced in an upper 200-1500 Å of the silicon oxide layer, as determined by XPS % atomic analysis, SIMS depth profiling analysis, or both, and the silicon oxide layer has an etch rate of less than about 200 Å/minute in a fluoride-based etchant.

60. A method of treating a silicon oxide layer, comprising:
applying steam in the presence of ozone to the silicon oxide layer, wherein at least about 80% of N and H are replaced in an upper 200-1500 Å of the silicon oxide layer, as determined by XPS %atomic analysis, SIMS depth profiling analysis, or both, and the silicon oxide layer has an etch rate of less than about 200 Å/minute in a fluoride-based etchant.

61. A method of treating a silicon oxide layer, comprising:
wet oxidizing the silicon oxide layer by applying a solution of ammonium hydroxide/hydrogen peroxide followed by a deionized water rinse, wherein at least about 80% of N and H are replaced in an upper 200-1500 Å of the silicon oxide layer, as determined by XPS % atomic analysis, SIMS depth profiling analysis, or both, and the silicon oxide layer has an etch rate of less than about 200 Å/minute in a fluoride-based etchant.

62. A method of treating a silicon oxide layer, comprising:
wet oxidizing the silicon oxide layer by applying a solution of hydrochloric acid/hydrogen peroxide followed by a deionized water rinse, wherein at least about 80% of N and H are replaced in an upper 200-1500 Å of the silicon oxide layer, as determined by XPS % atomic analysis, SIMS depth profiling analysis, or both and the silicon oxide layer has an etch rate of less than about 200 Å/minute in a fluoride-based etchant.

63. A method of treating a silicon oxide layer, comprising:
steam oxidizing the silicon oxide layer in the presence of ozone at a temperature of about 100-200° C. and a pressure of about 0.5-20 atm, wherein at least about 80% of N and H are replaced in an upper 200-1500 Å of the silicon oxide layer, as determined by XPS % atomic analysis, SIMS depth profiling analysis, or both.

64. A method of treating a silicon oxide layer, comprising:
wet oxidizing the silicon oxide layer in the presence of ozone at a temperature of about 100-200° C. and a pressure of about 0.5-20 atm, wherein at least about 80% of N and H are replaced in an upper 200-1500 Å of the silicon oxide layer, as determined by XPS % atomic analysis, SIMS depth profiling analysis, or both.

65. A method of fabricating an isolation region in a substrate, comprising:
forming a shallow trench in the substrate;
forming a polysilazane layer over the substrate and in the trench; and
wet oxidizing the polysilazane layer at a temperature of less than about 100° C. to form a silicon oxide layer having an etch rate of less than about 200 Å/minute in a fluoride-based etchant.

66. The method of claim 65, wherein forming the polysilazane layer comprises
spin coating a polysilazane solution onto the substrate to fill the trench; and
drying the polysilazane solution to form a solid-phase layer.

67. The method of claim 65, wherein the trench extends to a depth of less than about 1 micron into the substrate.

68. The method of claim 65, further comprising planarizing to remove the silicon oxide layer from the substrate and leave silicon oxide remaining within the trench to form a trench isolation region.

69. The method of claim 68, further comprising forming gate structures adjacent the trench isolation region, the trench isolation region being positioned between the gate structures.

70. The method of claim 69, wherein the gate structures comprise FET transistors.

71. A method of forming an isolation region within a silicon-comprising substrate, comprising:
forming a masking layer over the silicon-comprising substrate and an opening extending therethrough exposing a portion of the substrate;
etching the exposed portion of the substrate to form an opening extending into the substrate;
removing the masking layer;
spin coating a polysilazane layer onto the substrate and into the opening;
wet oxidizing the polysilazane layer at a temperature of less than about 100° C. to convert the polysilazane layer to a silicon oxide layer having an etch rate of less than about 200 Å/minute in a fluoride-based etchant; and
removing a portion of the silicon oxide layer to an upper surface of the substrate to form an isolation structure within the trench.

72. The method of claim 71, wherein wet oxidizing comprises applying water and ozone onto the polysilazane layer at a temperature of less than about 100° C. to produce a silicon oxide layer.

73. The method of claim 71, wherein wet oxidizing comprises applying a solution of ammonium hydroxide/hydrogen peroxide followed by a deionized water rinse.

74. The method of claim 71, wherein wet oxidizing comprises applying a solution of hydrochloric acid/hydrogen peroxide followed by a deionized water rinse.

75. The method of claim 71, wherein wet oxidizing comprising applying steam.

76. The method of claim 71, wherein removing the silicon oxide layer comprises planarizing the silicon oxide layer.

77. A method of forming an isolation region within a silicon-comprising substrate, comprising:
forming a shallow trench within the substrate, the trench having an oxide surface layer;
forming a silicon oxide layer over the oxide layer within the trench by:
spin coating a polysilazane layer onto the substrate and into the trench; and
wet oxidizing the polysilazane layer at a temperature of less than about 100° C. to form a silicon oxide layer having an etch rate of less than about 200 Å/minute in a fluoride-based etchant; and
planarizing the silicon oxide layer to form the isolation region within the trench.

78. A method for filling a trench in a layer situated on a semiconductor substrate, the method comprising:
spin coating a polysilazane layer to at least partially fill the trench; and
wet oxidizing the polysilazane layer at a temperature of less than about 100° C. to convert the polysilazane layer to a silicon oxide layer having an etch rate of less than about 200 Å/minute in a fluoride-based etchant.

79. A method of filling a shallow trench isolation trench with silicon dioxide, comprising:
spin coating a polysilazane layer to at least partially fill the trench; and
wet oxidizing the polysilazane layer at a temperature of less than about 100° C. to convert the polysilazane layer to a silicon oxide layer having an etch rate of less than about 200 Å/minute in a fluoride-based etchant.

80. The method of claim 79, further comprising planarizing the silicon oxide layer to form an oxide isolation region within the trench.

81. The method of claim 79, wherein the trench extends to a depth of less than about 1 micron into the substrate.

82. The method of claim 79, further comprising forming transistors on the substrate, the trench isolation trenches being situated between the transistors.

83. A method of fabricating a semiconductor device, comprising:
- depositing a layer of polysilazane onto a material layer; and
- processing the polysilazane layer in a wet oxidation by exposure to water and ozone at a temperature of less than about 100° C. to convert the polysilazane layer to a silicon oxide layer having an etch rate of less than about 200 Å/minute in a fluoride-based etchant.

84. A method of forming a semiconductor device, comprising:
- forming an opening in a material layer;
- depositing a polysilazane material within the opening; and
- processing the polysilazane material in a wet oxidation by exposure to water and ozone at a temperature of less than about 100° C. to convert the polysilazane layer to a silicon oxide layer having an etch rate of less than about 200 Å/minute in a fluoride-based etchant.

* * * * *

UNITED STATES PATENT AND TRADEMARK OFFICE
CERTIFICATE OF CORRECTION

PATENT NO. : 7,521,378 B2  
APPLICATION NO. : 10/883191  
DATED : April 21, 2009  
INVENTOR(S) : Fucsko et al.

Page 1 of 1

It is certified that error appears in the above-identified patent and that said Letters Patent is hereby corrected as shown below:

In column 13, line 63, in Claim 6, delete "comprising;" and insert -- comprising: --, therefor.

In column 16, line 38, in Claim 31, delete "Åof" and insert -- Å of --, therefor.

In column 19, line 5, in Claim 60, delete "%atomic" and insert -- % atomic --, therefor.

Signed and Sealed this

Twenty-second Day of September, 2009

David J. Kappos
*Director of the United States Patent and Trademark Office*